(12) United States Patent
Ogawa

(10) Patent No.: US 8,766,464 B2
(45) Date of Patent: Jul. 1, 2014

(54) INTEGRATED CIRCUIT DEVICE AND ELECTRONIC APPARATUS

(75) Inventor: Hideki Ogawa, Fujimi-machi (JP)

(73) Assignee: Seiko Epson Corporation (JP)

( * ) Notice: Subject to any disclaimer, the term of this patent is extended or adjusted under 35 U.S.C. 154(b) by 881 days.

(21) Appl. No.: 12/730,313

(22) Filed: Mar. 24, 2010

(65) Prior Publication Data
US 2011/0025699 A1 Feb. 3, 2011

(30) Foreign Application Priority Data
Jul. 28, 2009 (JP) ................................. 2009-175012

(51) Int. Cl.
*H01L 29/40* (2006.01)

(52) U.S. Cl.
USPC .......................................... 257/786; 345/531

(58) Field of Classification Search
USPC .......................................... 257/786; 345/531
See application file for complete search history.

(56) References Cited

U.S. PATENT DOCUMENTS

| | | | |
|---|---|---|---|
| 5,642,323 A * | 6/1997 | Kotani et al. | 365/230.03 |
| 7,149,882 B2 | 12/2006 | Glew et al. | |
| 2003/0201673 A1 | 10/2003 | Sim et al. | |
| 2005/0062733 A1 | 3/2005 | Morita | |
| 2006/0087013 A1 * | 4/2006 | Hsieh | 257/678 |
| 2009/0225107 A1 | 9/2009 | Nose et al. | |

FOREIGN PATENT DOCUMENTS

| | | |
|---|---|---|
| JP | 2005-266162 A | 9/2005 |
| JP | 2008-065294 A | 3/2008 |
| JP | 2008-224796 | 9/2008 |
| JP | 2009-053639 | 3/2009 |
| JP | 2009-164202 A | 7/2009 |

\* cited by examiner

*Primary Examiner* — Ahmed Sefer
(74) *Attorney, Agent, or Firm* — Harness, Dickey & Pierce, P.L.C.

(57) ABSTRACT

An integrated circuit device includes a first pad group connected to a first memory pad group arranged along a first chip side of a chip of an image memory stacked on the integrated circuit device, a second pad group connected to a second memory pad group arranged along a third chip side, a control section which controls display of an electro-optical device, and a third pad group from which a data signal and a control signal for display control. The first pad group is arranged along a first side of the integrated circuit device, wherein the second pad group is arranged along a third side facing the first side, and wherein the third pad group is arranged along a second side which intersects with the first side and the third side.

15 Claims, 16 Drawing Sheets

INSTRUCTION CODE INFORMATION

| COMMAND | INSTRUCTION |
|---------|-------------|
| CMA | INSA1<br>INSA2<br>INSA3<br>⋮ |
| CMB | INSB1<br>INSB2<br>INSB3<br>⋮ |
| CMC | INSC1<br>INSC2<br>INSC3<br>⋮ |
| ⋮ | ⋮ |

FIG. 9

COMMAND LIST

| COMMAND | CONTENT |
|---|---|
| RUN_SYS | MOVE TO RUN MODE |
| STBY | MOVE TO STANDBY MODE |
| SLP | MOVE TO SLEEP MODE |
| INIT_SYS_RUN | MOVE TO RUN MODE BY INITIALIZATION |
| INIT_DSPE_CFG | DISPLAY ENGINE INITIALIZATION |
| INIT_DSPE_TMG | DISPLAY TIMING INITIALIZATION |
| RD_REG | REGISTER READ |
| WD_REG | REGISTER WRITE |
| BST_RD_SDR | IMAGE MEMORY BURST READ |
| BST_WR_SDR | IMAGE MEMORY BURST WRITE |
| LD_IMG | LOAD FULL IMAGE |
| LD_IMG_AREA | LOAD AREA IMAGE |
| RD_WFM_INFO | WAVEFORM INFORMATION READ |
| UPD_GDRV_CLR | SCAN DRIVER CLEAR |
| WAIT_DSPE_TRG | DISPLAY ENGINE OPERATION COMPLETION WAITING |
| ⋮ | ⋮ |

FIG.10

INTEGRATED CIRCUIT DEVICE AND ELECTRONIC APPARATUS

This application claims priority based on Japanese Patent Application No. 2009-175012, filed on Jul. 28, 2009, which is incorporated in this specification.

TECHNICAL FIELD

An aspect of the present invention relates to an integrated circuit device, an electronic apparatus.

BACKGROUND ART

In the related art, display devices such as a liquid crystal display device and an electrophoretic display device are known. In such display devices, a display controller which controls the display of an electro-optical panel such as a liquid crystal panel or an electrophoretic panel is provided. For example, this display controller is mounted on a system board along with a host CPU and executes an image process such as a rotation process or the like for image data sent from a host side. A data signal or a control signal for controlling the display of the electro-optical panel is supplied to a panel module connected to the system board via a connector.

In this display controller, an image memory as a VRAM which stores image data is necessary. When an external image memory provided outside the display controller is used as the image memory, there is a problem in that the apparatus costs increase and the wiring to the system board (circuit board) becomes complex.

On the other hand, it is also possible to consider a method using a RAM (SRAM) laid out and arranged within an IC chip of the display controller as the image memory. For example, in Patent Document 1, a RAM-embedded driver IC in which a RAM serving as the image memory within the IC chip is embedded is disclosed. However, when the RAM serving as the image memory is laid out and arranged inside the IC, there is a problem in that a layout area of the IC may be increased or the sufficient storage capacity may not be secured.

RELATED ART DOCUMENT

Patent Document

[Patent Document 1] JP-A-2008-224796

DISCLOSURE OF THE INVENTION

Problem that the Invention is to Solve

According to several aspects of the invention, it is possible to provide an integrated circuit device and an electronic apparatus which supply a display control signal to an electro-optical device while reducing a layout area.

Means for Solving the Problem

An aspect of the invention relates to an integrated circuit device including: a first pad group connected to a first memory pad group arranged along a first chip side of a chip of an image memory stacked on the integrated circuit device; a second pad group connected to a second memory pad group arranged along a third chip side facing the first chip side of the chip of the image memory; a control section which controls display of an electro-optical device on the basis of image data stored in the image memory; and a third pad group from which a data signal and a control signal for controlling the display of the electro-optical device are output, wherein the first pad group is arranged along a first side of the integrated circuit device, wherein the second pad group is arranged along a third side facing the first side of the integrated circuit device, and wherein the third pad group is arranged along a second side which intersects with the first side and the third side of the integrated circuit device.

According to the aspect of the invention, the first and second memory pad groups of the image memory are connected to the first and second pad groups, thereby enabling a signal for the image memory to be transmitted to and received from the stacked image memory. On the basis of the image data read from the image memory, a signal for display control may be generated and supplied to an external electro-optical device via the third pad group. As compared to a method of arranging a memory block corresponding to the image memory in the core region of the integrated circuit device, the aspect of the invention may reduce the size of the integrated circuit device since the image memory is stacked on the integrated circuit device. Also, since the first and second pad groups for connecting to the first and second memory pad groups of the image memory are provided along the first and third sides of the integrated circuit device, a connection of the first and second memory pad groups and the first and second pad groups may be facilitated and the possibility of wiring faults may be reduced.

The aspect of the invention may include a fourth pad group for a host interface, and the fourth pad group may be arranged along a fourth side facing the second side of the integrated circuit device.

Since the fourth pad group for the host interface may be arranged by effectively using an empty region of the fourth side facing the second side of the integrated circuit device, it is possible to efficiently arrange the pad groups on the first, second, third, and fourth sides.

The aspect of the invention may include a fifth pad group from which a signal for controlling a power supply circuit of the electro-optical device is output, and the fifth pad group may be arranged along the second side of the integrated circuit device.

Since the fifth pad group for controlling the power supply circuit may be arranged on the same second side as that of the third pad group for display control, the improvement of mounting efficiency or the like may be promoted.

The aspect of the invention may include an analog circuit, and the analog circuit may be arranged in a non-overlap position in plan view for an area where the chip of the image memory is stacked.

It is possible to reduce the adverse effects of noise from the stacked image memory on the analog circuit, and it is possible to prevent erroneous operations or the like.

The aspect of the invention may include a plurality of memory blocks in which the image data is temporarily stored, a first memory block to an $L^{th}$ memory block among the plurality of memory blocks may be arranged between the first pad group and the control section, and an $L+1^{th}$ memory block to an $M^{th}$ ($1<L<M$) memory block among the plurality of memory blocks may be arranged between the second pad group and the control section.

Since the first to $L^{th}$ memory blocks and the $L+1^{th}$ to $M^{th}$ memory blocks are laid out and arranged by effectively using a region around the control section, layout efficiency may be improved.

In the aspect of the invention, a shield line of a first signal line group which connects the first pad group and the control section may be formed by a wiring layer of a lower layer of the first signal line group in a region of the first memory block to the $L^{th}$ memory block, and a shield line of a second signal line group which connects the second pad group and the control section may be formed by a wiring layer of a lower layer of the second signal line group in a region of the $L+1^{th}$ memory block to the $M^{th}$ memory block.

In the aspect of the invention, a first signal line group which connects the first pad group and the control section may be formed by a wiring layer of a top layer in a region of the first memory block to the $L^{th}$ memory block, and a second signal line group which connects the second pad group and the control section may be formed by a wiring layer of a top layer in a region of the $L+1^{th}$ memory block to the $M^{th}$ memory block.

According to the aspect of the invention, it is possible to reduce the adverse effects of noise from signal lines of the first and second pad groups on the memory block.

In the aspect of the invention, an $M+1^{th}$ memory block to an $N^{th}$ (1<L<M<N) memory block among the plurality of memory blocks may be arranged between the pad group arranged along the fourth side facing the second side of the integrated circuit device and the control section.

Layout efficiency may be further improved.

The aspect of the invention may include: a first I/O cell group connected to the first pad group; a second I/O cell group connected to the second pad group; and a third I/O cell group connected to the third pad group, the first pad group may include a first high-potential-side power supply pad, the second pad group may include a second high-potential-side power supply pad, the third pad group may include a third high-potential-side power supply pad, a first power supply line which is connected to the first high-potential-side power supply pad and supplies power to the first I/O cell group may be wired in a direction along the first side between the first pad group and the control section, a second power supply line which is connected to the second high-potential-side power supply pad and supplies power to the second I/O cell group may be wired in a direction along the third side between the second pad group and the control section, and a third power supply line which is connected to the third high-potential-side power supply pad and supplies power to the third I/O cell group may be wired in a direction along the second side between the third pad group and the control section.

Even when an I/O power supply voltage of the image memory to which signals of the first and second pad groups are connected is different from an I/O power supply voltage of the electro-optical device to which a signal of the third pad group is connected, it is possible to respond thereto.

In the aspect of the invention, the control section may control the display of the electro-optical device on the basis of the image data from the image memory in a stack mode in which the chip of the image memory is stacked on the integrated circuit device, and may control the display of the electro-optical device on the basis of external image data from an external image memory in a non-stack mode in which the chip of the image memory is not stacked on the integrated circuit device.

The external image memory may also be used by switching the stack mode and the non-stack mode.

The aspect of the invention may include a pad for stack identification in which a first power supply voltage is set by a bonding wire in the stack mode, and a second power supply voltage is set by a bonding wire in the non-stack mode.

It is possible to set the stack mode or the non-stack mode of the integrated circuit device only by setting the voltage by a boding wire to the pad for stack identification.

The aspect of the invention may include a host interface which executes an interface process with a host; and an information register which offers information to the host, the information register may store instruction selection information for selecting instruction code information in which an instruction code constituting each command issued by the host is described, instruction code information selected by the instruction selection information stored in the information register from among a plurality of pieces of instruction code information may be loaded to the information memory at the time of manufacturing an electronic apparatus including the electro-optical device, and the control section may control an operation of the integrated circuit device on the basis of the command issued by the host and the instruction code information read from the information memory at the time of an actual operation of the electronic apparatus.

It is possible to offer instruction selection information for selecting instruction code information to the host using the information register. Thereby, it is possible to load instruction code information corresponding to the instruction selection information at the time of manufacturing the electronic apparatus. At the time of an actual operation of the electronic apparatus, it is possible to implement operation control for the integrated circuit device on the basis of the command from the host and the instruction code information read from the information memory. Thereby, it is possible to efficiently manufacture the electronic apparatus.

In the aspect of the invention, the information register may store stack identification information for identifying a stack mode in which the chip of the image memory storing image data is stacked on the integrated circuit device and a non-stack mode in which the image memory chip is not stacked on the integrated circuit device as the instruction selection information.

It is possible to notify the host of whether the integrated circuit device is in the stack mode or the non-stack mode by the information register.

In the aspect of the invention, in the stack mode, instruction code information for the stack mode among the plurality of pieces of instruction code information may be loaded to the information memory at the time of manufacturing the electronic apparatus, and the operation of the integrated circuit device may be controlled on the basis of the command issued by the host and the instruction code information for the stack mode at the time of the actual operation of the electronic apparatus. In the non-stack mode, instruction code information for the non-stack mode among the plurality of pieces of instruction code information may be loaded to the information memory at the time of manufacturing the electronic apparatus, and the operation of the integrated circuit device may be controlled on the basis of the command issued by the host and the instruction code information for the non-stack mode at the time of the actual operation of the electronic apparatus.

When the integrated circuit device is in the stack mode, the operation of the integrated circuit device may be controlled on the basis of instruction code information for the stack mode at the time of the actual operation of the electronic apparatus. In the non-stack mode, the operation of the integrated circuit device may be controlled on the basis of instruction code information for the non-stack mode.

The aspect of the invention may include a pad for stack identification in which a first power supply voltage is set by a bonding wire in the stack mode, and a second power supply voltage is set by a bonding wire in the non-stack mode, and the information register may store the stack identification information set on the basis of the voltage of the pad for stack identification.

It is possible to set the stack mode or the non-stack mode of the integrated circuit device only by setting the voltage by a boding wire to the pad for stack identification.

Another aspect of the invention relates to an electronic apparatus including: the integrated circuit device described above; and the electro-optical device.

BRIEF DESCRIPTION OF THE DRAWINGS

FIGS. 4(A) and 4(B) are diagrams illustrating a shield method for noise reduction or the like.

FIG. 9 is a diagram illustrating instruction code information.

FIG. 10 is an example of commands issued by a host.

MODE FOR CARRYING OUT THE INVENTION

Preferred embodiments of the invention are described below in detail. The embodiments described below do not in any way limit the scope of the invention defined by the claims laid out herein. All elements of the embodiments described below should not necessarily be taken as essential requirements for the invention.

1. Configuration

Figure 1:
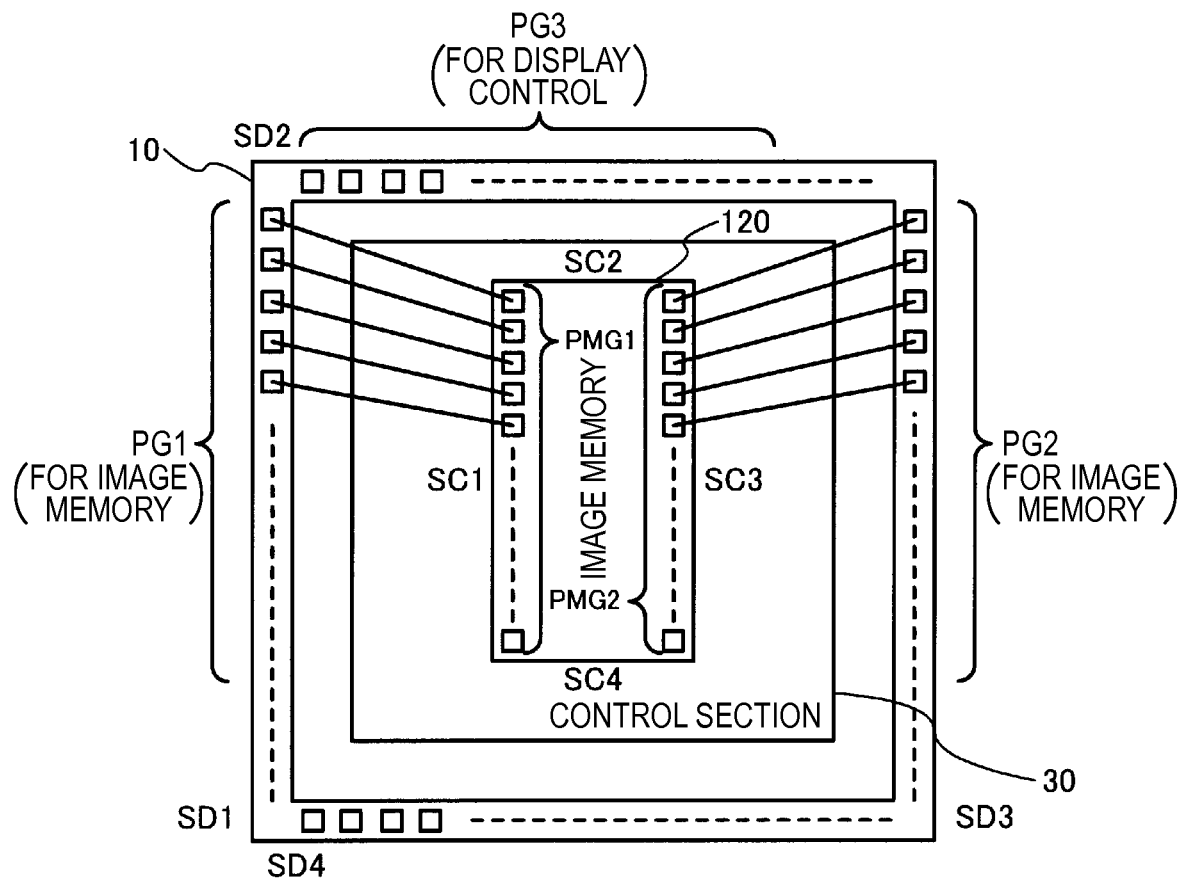
FIG. 1 is a configuration example of an integrated circuit device of this embodiment.

FIG. 1 shows a configuration example of an integrated circuit device 10 of this embodiment. In the integrated circuit device 10, a chip of an image memory 120 which stores image data is stacked. That is, two IC chips (an image memory and a display controller) manufactured by different manufacturing processes are stacked and packaged by stack packaging.

The integrated circuit device 10 includes a first pad group PG1 for the image memory, a second pad group PG2 for the image memory, and a third pad group PG3 for display control. That is, the first, second, and third pad groups PG1, PG2, and PG3 are arranged to peripheral portions of the chip of the integrated circuit device 10. The integrated circuit device 10 includes a control section 30 which controls the display of an electro-optical device such as a liquid crystal display device or an electrophoretic display device on the basis of the image data (display data) stored in the image memory 120.

Here, the first pad group PG1 (an electrode group) is connected to a first memory pad group PMG1 arranged along a first chip side SC1 of the chip of the image memory 120 stacked on the integrated circuit device 10. Specifically, for example, the first pad group PG1 and the first memory pad group PMG1 are internally wired within a package by a boding wire.

The second pad group PG2 (an electrode group) is connected to a second memory pad group PMG2 arranged along a third chip side SC3 facing the first chip side SC1 of the chip of the image memory 120. Specifically, for example, the second pad group PG2 and the second memory pad group PMG2 are internally wired within a package by a boding wire.

A data signal and a control signal for controlling the display of the electro-optical device are output from the third pad group PG3. For example, the data signal or the control signal to be supplied to a data driver (source driver) or a scan driver (gate driver) provided in the electro-optical device is output. As the electro-optical device, various devices such as a liquid crystal display device, an electrophoretic display device, and an organic EL display device may be assumed.

The control section 30 executes various control processes, and executes a display control process for the electro-optical device. Also, the control section 30 executes an entire control process for the integrated circuit device 10, a memory control process for the image memory 120, and the like. This control section 30 may be implemented by a gate array circuit, a processor, or the like.

In FIG. 1, the first pad group PG1 for the image memory is arranged along a first side SD1 of the integrated circuit device 10, and the second pad group PG2 for the image memory is arranged along a third side SD3 facing the first side SD1 of the integrated circuit device 10. The third pad group PG3 for display control is arranged along a second side SD2 intersecting with the first side SD1 and the third side SD3 of the integrated circuit device 10. That is, the first, second, and third pad groups PG1, PG2, and PG3 are arranged in pad regions of the peripheral portions of the integrated circuit device 10 along the sides SD1, SD2, and SD3.

Although not shown, first, second, and third I/O cell groups connected to the first, second, and third pad groups PG1, PG2, and PG3 are arranged in the integrated circuit device 10. The first, second, and third I/O cell groups are arranged side-by-side in I/O regions of the inner sides of the pad regions where the first, second, and third pad groups are arranged. An analog circuit such as a PLL, a memory block serving as a work memory, or the like as well as the control section 30 may be arranged in core regions of the inner sides of the pad regions and the I/O regions.

For example, the first and second memory pad groups PMG1 and PMG2 are pads for inputting/outputting an address signal, a data signal, or a control signal of the image memory 120. In an example of an SDRAM (Synchronous DRAM), the control signal is a chip select signal, a clock enable signal, a clock signal, a RAS signal, a CAS signal, or a write enable signal. The control section 30 may write or read image data of the image memory 120 by connecting the first and second memory pad groups PMG1 and PMG2 to the first and second pad groups PG1 and PG2 and exchanging the address signal, the data signal, and the control signal.

According to the integrated circuit device 10 of this embodiment described above, it is possible to exchange a data signal, an address signal, and a control signal for the image memory with the stacked image memory 120 by internally connecting the pad groups PG1 and PG2 to the memory pad groups PMG1 and PMG2. On the basis of image data read from the image memory 120, a data signal and a control signal for display control may be generated and supplied to an external electro-optical device (electro-optical panel) via the pad group PG3.

For example, a method using an external image memory as the image memory may be considered as a first comparative example of this embodiment. However, in the first comparative example, it is necessary to wire signal lines of a data signal, an address signal, a control signal for the image memory, and the like to a circuit board (system board) on which a package of the integrated circuit device is mounted. Accordingly, the wiring of signal lines for the image memory in the circuit board is complex, resulting in degradation in the mounting efficiency. When a distance is separated between a mounting position of the integrated circuit device and a mounting position of the external image memory, a data read/write error may be caused by signal delay due to the parasitic capacitance/parasitic resistance of a signal line connected to the integrated circuit device and the external image memory.

For this point, in this embodiment, the image memory 120 is stacked on the integrated circuit device 10 as the display controller. Accordingly, even though the external image memory is not used, the image memory 120 within the IC packaging may be used as a memory which stores frame image data. Therefore, it is possible to prevent the complexity of wiring of signal lines connected to the external image memory, the degradation of mounting efficiency, or the occurrence of data read/write errors due to signal delay. As described later, it is possible to cause the integrated circuit device 10 of one product to correspond to both a stack mode using the internal image memory 120 and a non-stack mode using the external image memory.

As a second comparative example of this embodiment, a method of laying out and arranging a memory block (SRAM) corresponding to the image memory in the core region of the integrated circuit device and storing frame image data in the memory block may be considered.

However, in the second comparative example, the chip area of the integrated circuit device may be increased and the cost may be increased since it is necessary to lay out and arrange a memory block having the storage capacity corresponding to frame image data in the core region of the integrated circuit device.

For this point, in this embodiment, it is unnecessary to arrange the above-described memory block in the core region since the image memory 120 is stacked on the integrated circuit device 10. As compared to the second comparative example, this embodiment may reduce the chip area of the integrated circuit device 10 and reduce the cost. For example, it is easy to adopt a high-speed memory device such as an SDRAM in which a burst read operation or a burst write operation is possible when the image memory 120 is stacked. Accordingly, this embodiment may read/write high-speed image data as compared to the second comparative example.

In this embodiment, when the memory pad group PMG1 is arranged to the chip side SC1 as the long side of the image memory 120, the pad group PG1 is arranged along the side SD1 of the integrated circuit device 10 corresponding to the chip side SC1 in the same signal sequence as that of the memory pad group PMG1. Likewise, when the memory pad group PMG2 is arranged to the chip side SC3 as the long side of the image memory 120, the pad group PG2 is arranged along the side SD3 of the integrated circuit device 10 corresponding to the chip side SC3 in the same signal sequence as that of the memory pad group PMG2. Accordingly, the memory pad groups PMG1 and PMG2 are arrayed on the chip sides SC1 and SC3 of both the sides of the image memory 120, the memory pad groups PMG1 and PMG2 and the pad groups PG1 and PG2 of the integrated circuit device 10 may be connected without overlapping with the bonding wire. Accordingly, it is possible to easily wire signal lines by stacking the image memory 120 in which the memory pad groups PMG1 and PMG2 are arranged side-by-side on both the sides of the chip on the integrated circuit device 10, and it is possible to reduce the possibility of wiring faults such as the short-circuit of a bonding wire.

For example, the pad groups PG1 and PG2 for the image memory belong to the same power supply group in which the same power supply voltage is supplied to the I/O cell. Thus, it is difficult to stack the chip of the image memory 120 in which the memory pad groups PMG1 and PMG2 are arranged on both the chip sides SC1 and SC3.

For this point, in FIG. 1, the pad group PG1 connected to the memory pad group PMG1 of the chip side SC1 of the image memory 120 is arranged on the side SD1 of the integrated circuit device 10, and the pad group PG2 connected to the memory pad group PMG2 of the chip side SC3 is arranged on the side SD3 of the integrated circuit device 10. According to this embodiment, it is possible to stack the image memory 120 on the integrated circuit device 10 even when the image memory 120 is of a type in which the memory pad groups PMG1 and PMG2 of the same power supply group are arranged on both the side of the chip.

In this embodiment, the pad group PG3 for display control is arranged along the side SD2 intersecting with the sides SD1 and SD3 on which the pad groups PG1 and PG2 for the image memory are arranged. Accordingly, it is possible to prevent a bonding wire which internally connects the memory pad groups PMG1 and PMG2 and the pad groups PG1 and PG2 from overlapping with a bonding wire which connects the pad group PG3 and an internal terminal of the package. Thereby, it is possible to facilitate the wiring of a bonding wire and reduce wiring faults such as short-circuiting of a bonding wire.

When a configuration is made so that the stack mode and the non-stack mode may be switched as described later, the pad groups PG1 and PG2 for the image memory are connected to the external image memory via an external terminal (for example, a bump) of the package of the integrated circuit device 10 and the wiring of the circuit board. The pad group PG3 for display control is connected to the electro-optical device via an external terminal of the package and the wiring of a circuit board or connector. Accordingly, it is possible to facilitate the wiring of signal lines in the circuit board and improve the mounting efficiency by collectively arranging the pad groups PG1 and PG2 for the image memory on the sides SD1 and SD3 and collectively arranging the pad group PG3 for display control on the side SD2 different from the sides SD1 and SD3. The pad groups PG1 and PG2 for the image memory and the pad group PG3 for display control have a large number of pads, and usually have different power supply voltages serving as references. Accordingly, it is possible to improve the layout efficiency of the chip or the mounting efficiency of the circuit board by collectively arranging the pad groups on separate sides as in FIG. 1.

Figure 2:
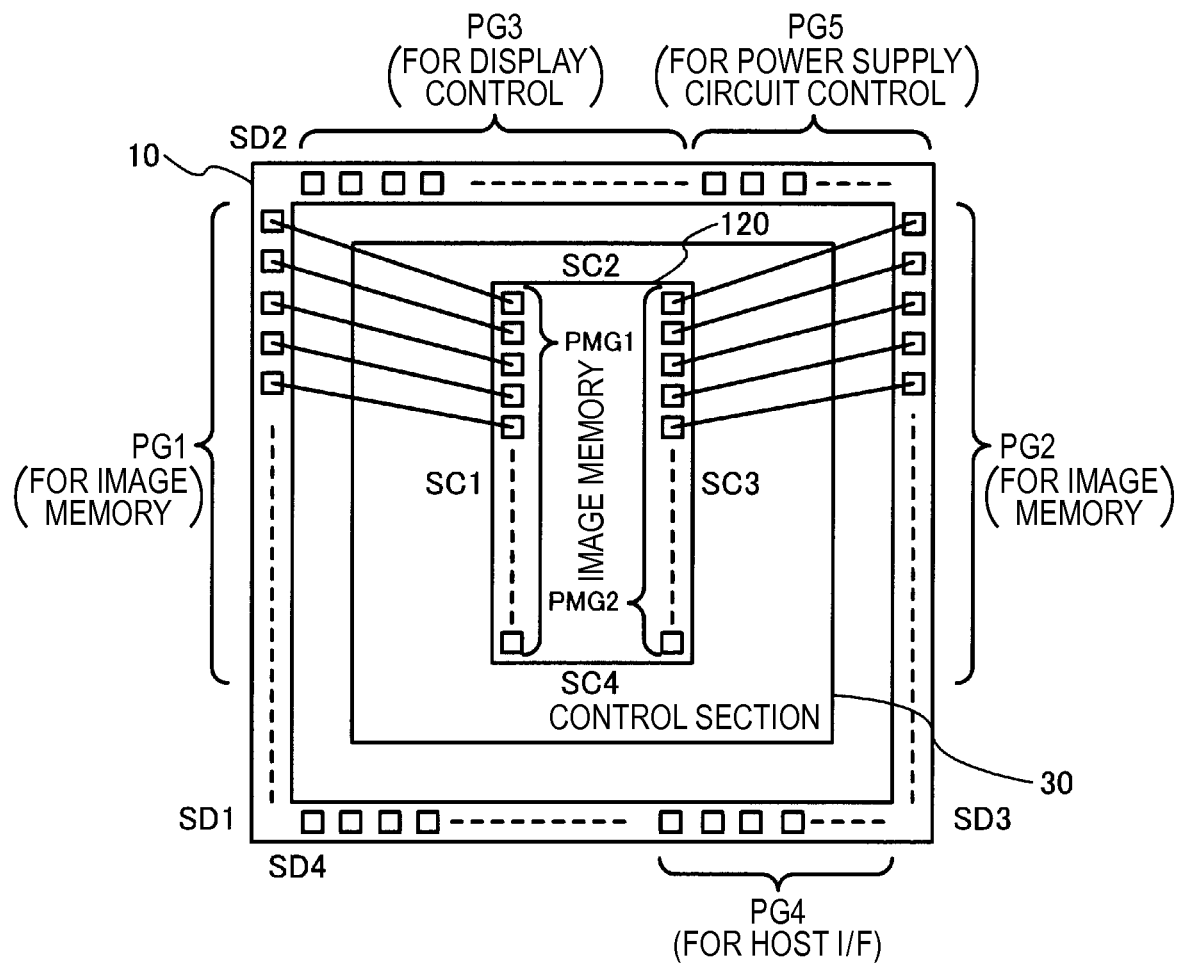
FIG. 2 is a detailed configuration example of the integrated circuit device of this embodiment.

A further detailed arrangement example of the pad groups is shown in FIG. 2. In FIG. 2, the integrated circuit device 10 includes a fourth pad group PG4 for a host I/F (interface). The fourth pad group PG4 is arranged along a fourth side SD4 facing the second side SD2 of the integrated circuit device 10.

In FIG. 2, the integrated circuit device 10 includes a fifth pad group PG5 from which a signal for controlling a power supply circuit of the electro-optical device is output. The fifth pad group PG5 is arranged along the second side SD2 of the integrated circuit device 10.

For example, in the integrated circuit device 10 such as a display controller, a host I/F is necessary to enable the host to issue a command to the integrated circuit device 10 or input image data from the host. Since it is necessary for the host I/F to transmit/receive a data signal or the like, the number of pads for the host I/F is usually large.

On the other hand, since the pad groups PG1 and PG2 for the image memory are arranged along the sides SD1 and SD3 and the pad group PG 3 for display control is arranged along the side SD2 in FIG. 2, it is difficult to secure an empty region where pads are arranged in the regions along the sides.

For this point, in this embodiment, the pad group PG4 for the host I/F is arranged by effectively using the empty region of the side SD4 facing the side SD2. The pad groups may be efficiently arranged on the sides SD1, SD2, SD3, and SD4. That is, the pad groups PG1 and PG2 for the image memory may be collectively arranged on the sides SD1 and SD3, the pad group PG3 for display control may be collectively arranged on the side SD2, and the pad group PG4 for the host I/F may be collectively arranged on the side SD4. Accordingly, it is possible to implement an efficient pad arrangement since each pad group PG1, PG2, PG3, or PG4 as one group having a large number of pads may be collectively arranged on each side. In terms of external terminals (for example, bumps or IC pins) of the package of the integrated circuit device 10, it is also possible to collectively arrange an external terminal for the image memory, an external terminal for display control, and an external terminal for the host I/F in nearby places. Accordingly, it is possible to simplify the wiring of signal lines in the circuit board and improve the mounting efficiency. For example, part of the pad group PG4 for the host I/F may be arranged in a region along the side SD3.

In FIG. 2, the pad group PG5 for controlling the power supply circuit is arranged on the same side SD2 as that of the pad group PG3 for display control. The power supply circuit supplies power to the electro-optical device to which a data signal and a control signal for display control are output from the pad group PG3. Accordingly, a signal line for display control and a signal line for power supply circuit control to be wired via an external terminal of a package of the integrated circuit device 10 from the pad groups PG3 and PG5 are drawn out and wired in the same direction on the circuit board by arranging the pad group PG3 for display control and the pad group PG5 for power supply circuit control on the same side SD2. Accordingly, signal lines in the circuit board may be efficiently wired and the mounting efficiency may be improved.

2. Detailed Layout Arrangement

Next, a detailed layout arrangement example of the integrated circuit device 10 of this embodiment will be described.

Figure 3:
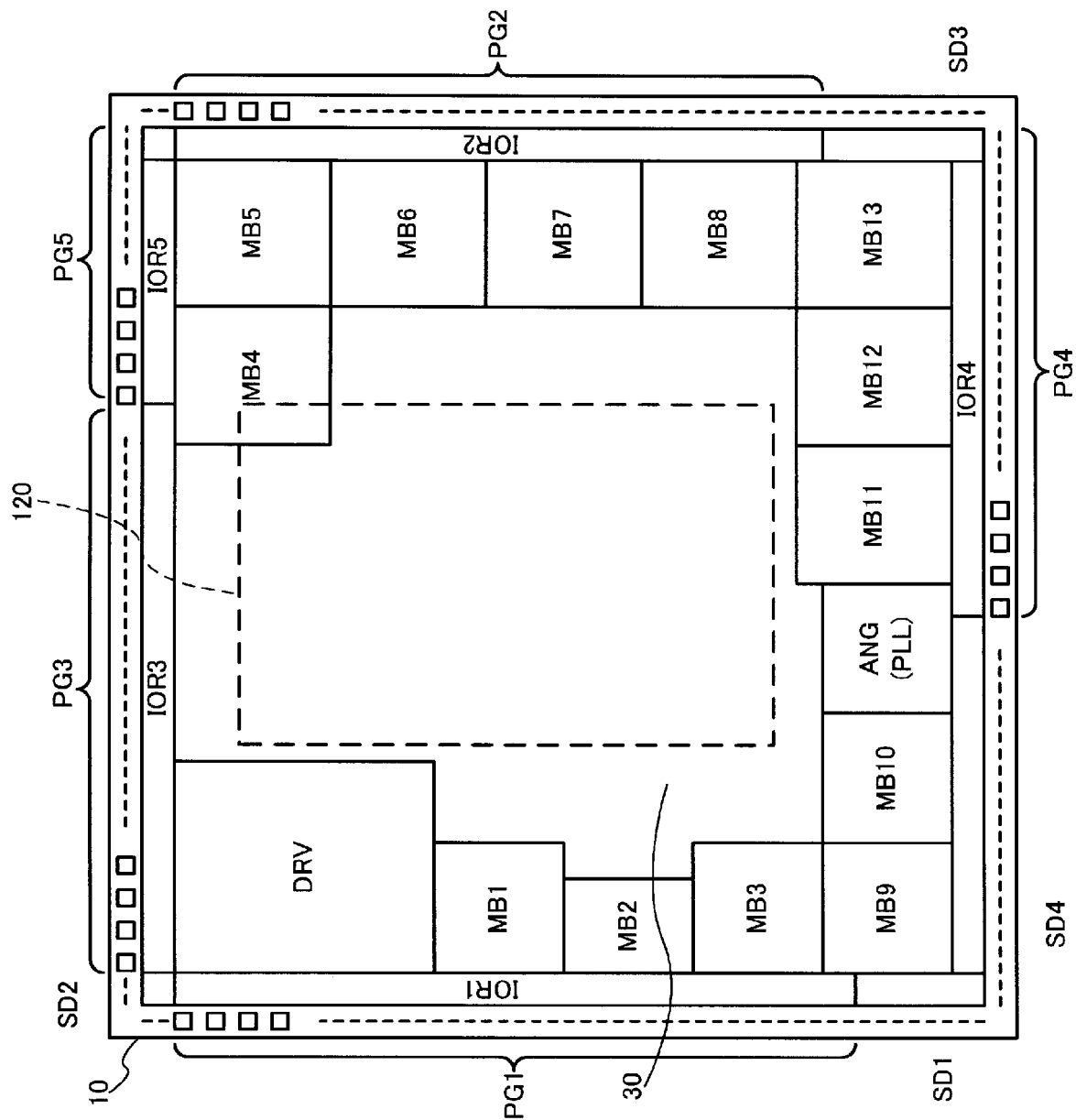
FIG. 3 is a layout arrangement example of the integrated circuit device of this embodiment.

In FIG. 3, an I/O region IOR1 is provided in an inner side (inner peripheral region) of a pad region where the pad group PG1 is arranged. In the I/O region IOR1, an I/O cell group connected to the pad group PG1 is arranged. Likewise, I/O regions IOR2, IOR3, IOR4, and IOR5 are provided on inner sides of the pad regions where the pad groups PG2, PG3, PG4, and PG5 are arranged, and each I/O cell group connected to each pad group is arranged in the I/O region. The I/O cell is an input/output cell including at least one of an input buffer and an output buffer.

The control section 30, an analog circuit ANG, memory blocks MB1 to MB13, and a buffer section DRV for display control are arranged in the core regions of the inner sides of the pad regions and the I/O regions.

For example, the analog circuit ANG (an analog macro circuit) is a PLL (Phase Locked Loop) circuit. For example, the PLL circuit includes a phase comparison circuit, a low pass filter, and a voltage-controlled oscillation circuit (VCO) and generates a clock to be used by the integrated circuit device 10. The analog circuit ANG is not limited to the PLL circuit. For example, various analog circuits including at least one of an operational amplifier, a comparator, a current mirror circuit, and a bias circuit may be assumed.

In FIG. 3, the analog circuit ANG is arranged in a non-overlap position in plan view for an area where the chip of the image memory 120 is stacked. For example, in FIG. 3, a stack area of the image memory 120 is set in a position shifted from the center of the integrated circuit device 10 to the side SD2 on which the pad group PG3 is provided. The analog circuit ANG is arranged between the stack area and the side SD4 so that the analog circuit ANG does not overlap with the stack area.

It is possible to reduce the adverse effects of noise from the stacked image memory 120 on the analog circuit ANG and it is possible to prevent erroneous operations of the analog circuit ANG or the like.

FIG. 3 includes a plurality of memory blocks MB1 to MB13 in which image data of the image memory 120 is temporarily stored. The plurality of memory blocks MB1 to MB13 functions as a work memory for various processes such as an image process and the like to be executed by the control section 30. For example, each memory block of MB1 to MB13 may include a memory cell array in which a plurality of memory cells is arranged and peripheral circuits (for example, a row address decoder, a column address decoder, and the like) thereof.

In FIG. 3, the memory blocks MB1, MB2, and MB3 (first to $L^{th}$ memory blocks in a broad sense) among the plurality of memory blocks MB1 to MB13 are arranged between the pad group PG1 and the control section 30. The memory blocks MB4, MB5, MB6, MB7, and MB8 ($L+1^{th}$ to $M^{th}$ memory blocks in a broad sense. $1<L<M$) among MB1 to MB13 are arranged between the pad group PG2 and the control section 30. That is, the memory blocks MB1 to MB3 are arranged in a region of the side SD1 of the control section 30, and the memory blocks MB4 to MB8 are arranged in a region of the side SD3 of the control section 30.

In FIG. 3, the memory blocks MB9, MB10, MB11, MB12, and MB13 ($M+1^{th}$ to $N^{th}$ memory blocks in a broad sense. $1<L<M<N$) among MB1 to MB13 are arranged between the pad group (PG4 or the like) arranged along the side SD4 and the control section 30. That is, the memory blocks MB9 to MB13 are arranged in a region of the side SD4 of the control section 30.

Since the memory blocks MB1 to MB13 are laid out and arranged by effectively using a peripheral region of the control section 30 in FIG. 3 as described above, layout efficiency may be improved.

For example, the display controller executes various image processes such as a rotation process and the like for image data stored in the image memory 120. When a work memory for the image process is constituted by one large memory block, a wasted wiring region of lines of signals to be transmitted to and received from the control section 30 may be increased, layout efficiency may be degraded, and the chip area may be increased.

For this point, since the region of a connection to the control section 30 is increased when the work memory for the image process and the like is divided into the plurality of memory blocks MB1 to MB13 as shown in FIG. 3, it is possible to reduce the area of a wiring region of lines of signals to be transmitted to and received from the control section 30 as compared to the case where the work memory is constituted by one memory block. Accordingly, layout efficiency may be improved and the chip area may be reduced.

In FIG. 3, first, it is possible to adopt a method of laying out and arranging the rectangular memory blocks MB1 to MB13 in inner peripheral regions of the I/O regions IOR1 to IOR5, and laying out and arranging a logic circuit of the control section 30 in an empty region of the core regions by the automatic arrangement wiring of the gate array and the like. When the above-described method is adopted, it is possible to simplify the layout work and also it is possible to improve layout efficiency. That is, for example, it is possible to use a macroblock appropriable for other products as the memory blocks MB1 to MB13, the analog circuit ANG, and the buffer section DRV for display control. For example, this macroblock is fixed in shape and size. Accordingly, first, this macroblock is arranged along the inner periphery of the I/O regions IOR1 to IOR5. Thereafter, the control section 30 is laid out and arranged by the automatic arrangement wiring of the gate array in an empty region where the macroblock is not arranged. The highly efficient layout arrangement may be implemented while effectively using a macroblock to be used by other products and the chip area may be reduced.

When the memory blocks are arranged around the control section 30 as shown in FIG. 3, it is necessary to wire lines of signals for the image memory to be exchanged between the control section 30 and the image memory 120, on the memory block.

On the other hand, when the signal lines for the image memory are wired on the memory block, erroneous operations such as a read/write error of the memory block may be caused by digital noise of the signal lines. In this embodiment, a method of shielding such noise is adopted.

For example, in this embodiment, a shield line of a PG1 signal line group (first signal line group) which connects the pad group PG1 and the control section 30 is formed by a wiring layer of a lower layer of the PG1 signal line group in a region of the memory blocks MB1 to MB3 (the first to $L^{th}$ memory blocks). Likewise, a shield line of a PG2 signal line group (second signal line group) which connects the pad group PG2 and the control section 30 is formed by a wiring layer of a lower layer of the PG2 signal line group in a region of the memory blocks MB4 to MB8 (the $L+1^{th}$ to $M^{th}$ memory blocks).

Figure 4A:
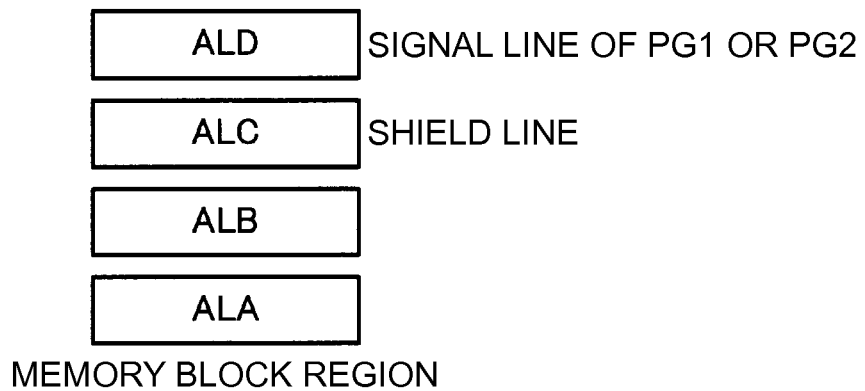

That is, as shown in FIG. 4(A), a shield line for noise reduction is formed by a lower wiring layer ALC than a wiring layer ALD which forms signal lines of PG1 and PG2. For example, a shield line is formed by a lower aluminum wiring layer ALC than an aluminum wiring layer ALD. It is possible to reduce the adverse effects of digital noise from the signal lines of PG1 and PG2 on memory blocks formed by wiring layers ALA and ALB of lower layers, and it is possible to prevent erroneous operations or the like of the memory blocks.

Alternatively, in this embodiment, the PG1 signal line group (first signal line group) which connects the pad group PG1 and the control section 30 may be formed by a wiring layer of the top layer in the region of the memory blocks MB1 to MB3 (first to $L^{th}$ memory blocks), and the PG2 signal line group (second signal line group) which connects the pad group PG2 and the control section 30 may be formed by a wiring layer of the top layer in the region of the memory blocks MB4 to MB8 ($L+1^{th}$ to $M^{th}$ memory blocks).

Figure 4B:
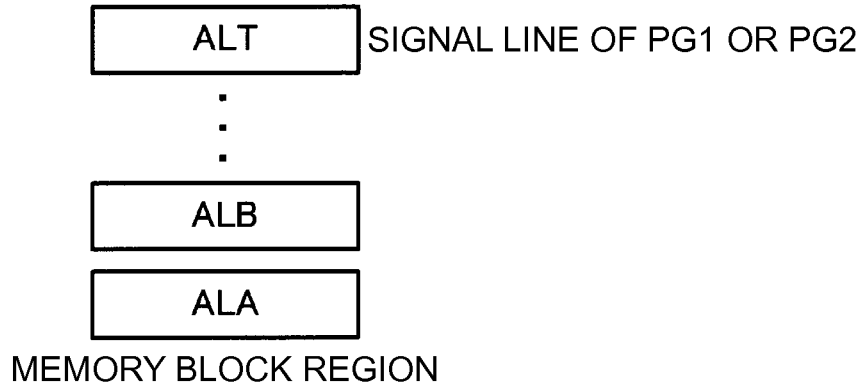

That is, as shown in FIG. 4(B), the signal lines of PG1 and PG2 are formed by a wiring layer ALT of the top layer. It is possible to reduce the adverse effects of digital noise from the signal lines of PG1 and PG2 on the memory blocks formed by wiring layers ALA and ALB of lower layers, and it is possible to prevent erroneous operations or the like of the memory blocks.

Next, a method of wiring a power supply line in the I/O region will be described using FIG. 5.

Figure 5:
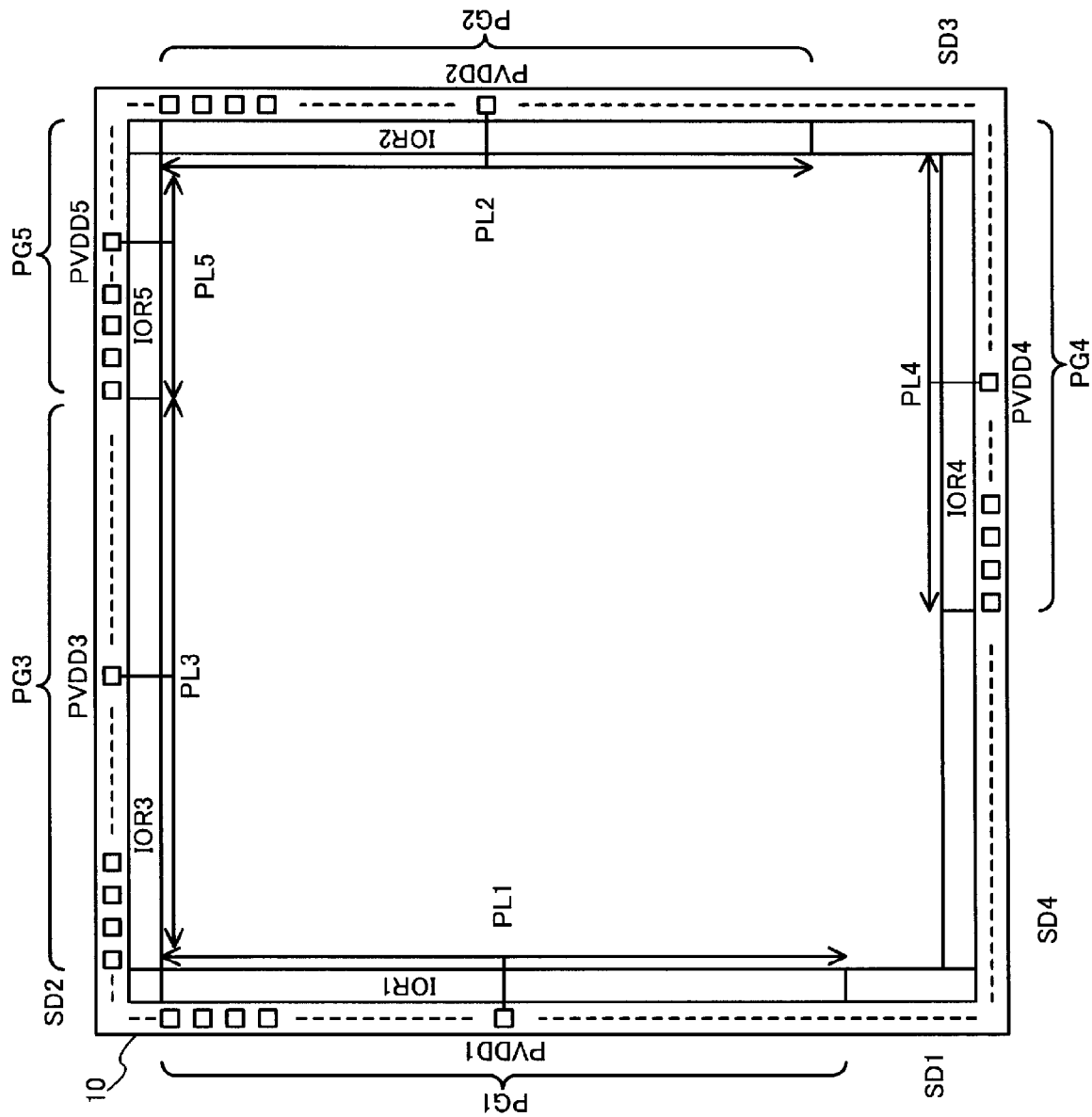
FIG. 5 is a diagram illustrating a method of providing a power supply line of each I/O region.

In FIG. 5, a first I/O cell group connected to the pad group PG1 is arranged in the I/O region IOR1, a second I/O cell group connected to the pad group PG2 is arranged in the I/O region IOR2, and a third I/O cell group connected to the pad group PG3 is arranged in the I/O region IOR3. Fourth and fifth I/O cell groups connected to the fourth and fifth pad groups PG4 and PG5 are arranged in the I/O regions IOR4 and IOR5.

The pad group PG1 includes a first high-potential-side power supply pad PVDD1, the pad group PG2 includes a second high-potential-side power supply pad PVDD2, and the pad group PG3 includes a third high-potential-side power supply pad PVDD3. Likewise, the pad groups PG4 and PG5 include fourth and fifth high-potential-side power supply pads PVDD4 and PVDD5.

In FIG. 5, a first power supply line PL1 which is connected to the high-potential-side power supply pad PVDD1 and supplies power to the I/O cell group of the I/O region IOR1 is wired between the pad group PG1 and the control section 30 in a direction along the side SD1.

Also, a second power supply line PL2 which is connected to the high-potential-side power supply pad PVDD2 and supplies power to the I/O cell group of the I/O region IOR2 is wired between the pad group PG2 and the control section 30 in a direction along the side SD3.

Also, a third power supply line PL3 which is connected to the high-potential-side power supply pad PVDD3 and supplies power to the I/O cell group of the I/O region IOR3 is wired between the pad group PG3 and the control section 30 in a direction along the side SD2.

Likewise, a fourth power supply line PL4 which is connected to the high-potential-side power supply pad PVDD4 and supplies power to the I/O cell group of the I/O region IOR4 is wired between the pad group PG4 and the control section 30, and a fifth power supply line PL5 which is connected to the high-potential-side power supply pad PVDD5 and supplies power to the I/O cell group of the I/O region IOR5 is wired between the pad group PG5 and the control section 30.

FIG. 5 shows the power supply lines PL1 to PL5 wired to the inner sides of the I/O regions IOR1 to IOR5 so that the figure is easily viewed, but the power supply lines PL1 to PL5 are actually wired on the I/O regions IOR1 to IOR5.

In this embodiment, the power supply lines PL1 to PL5 are not connected, and are electrically separated within the chip. Accordingly, for example, different power supply voltages are supplied to the power supply pads PVDD1 to PVDD5, and these power supply voltages may be supplied to the I/O cell groups of the I/O regions IOR1 to IOR5. That is, I/O power supply voltages may be separated.

For example, the power supply voltage MVDD for the image memory is supplied to the power supply pads PVDD1 and PVDD2, and the power supply voltage DVDD for display control is supplied to the power supply pad PVDD3. The power supply voltage MVDD for the image memory is supplied to the I/O cell groups of the I/O regions IOR1 and IOR2, and the power supply voltage DVDD for display control is supplied to the I/O cell group of the I/O region IOR3.

Even when the I/O power supply voltage (operation power supply voltage) of the image memory 120 connected to signals of the pad groups PG1 and PG2 is different from the I/O power supply voltage of the external electro-optical device (panel module) connected to a signal of the pad group PG3, it is possible to respond thereto. That is, even when a signal level conversion circuit is not provided, the image memory 120 and the external electro-optical device may be connected to the integrated circuit device 10, and the convenience may be improved. The I/O power supply voltage (operation power supply voltage) may be connected to various different types of electro-optical devices, and general-purpose properties may also be improved.

Figure 6:
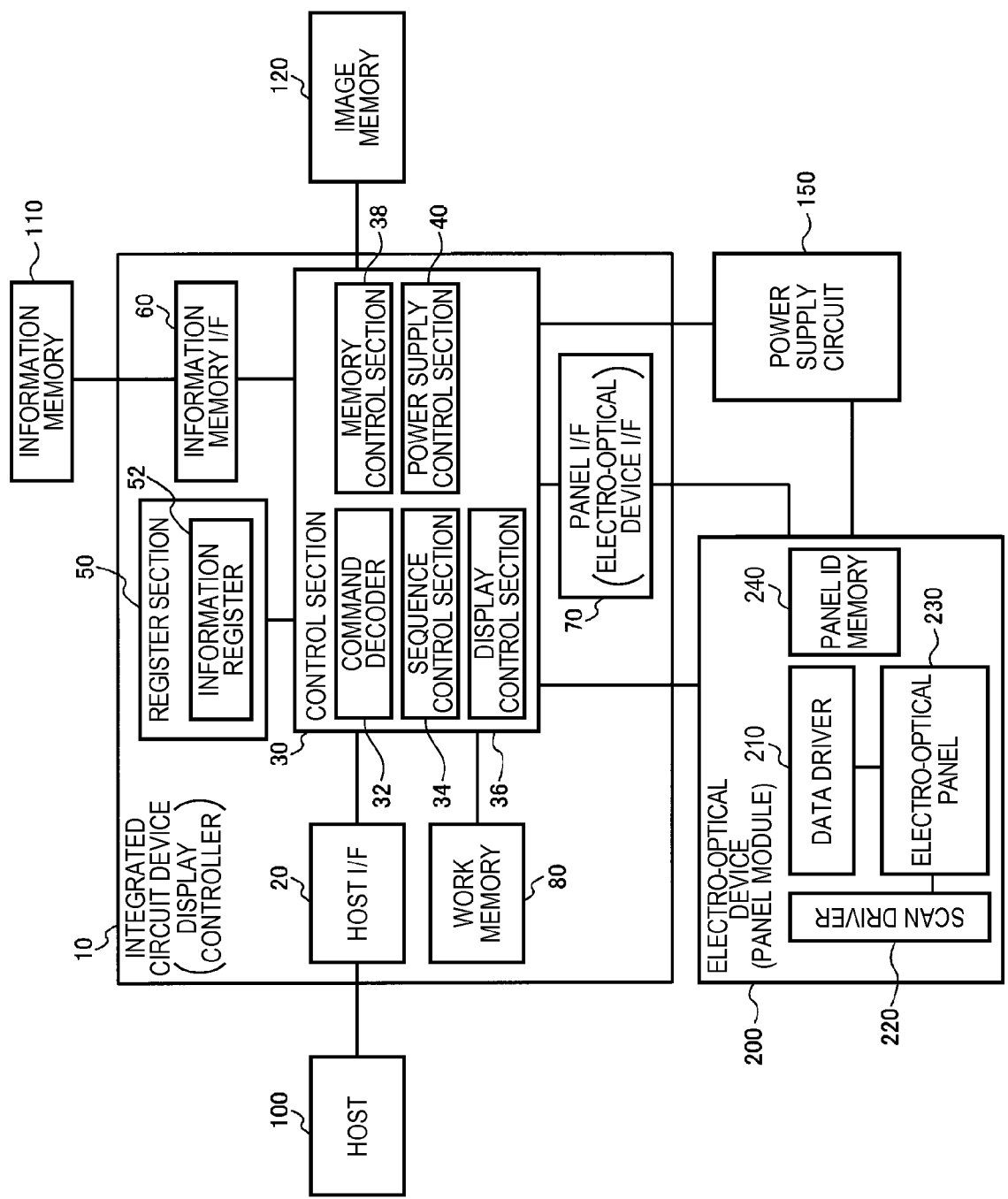
FIG. 6 is a configuration example of the integrated circuit device of this embodiment and an electronic apparatus including the same.

3. Detailed Configuration Example of Integrated Circuit Device and Electronic Apparatus FIG. 6 is a configuration example of the integrated circuit device 10 of this embodiment and an electronic apparatus including the same. The electronic apparatus includes the integrated circuit device 10 which functions as a display controller or the like, and an electro-optical device 200 of which display is controlled by the integrated circuit device 10. A host 100, an information memory 110, an image memory 120, a power supply circuit 150, and the like may also be included.

The electronic apparatus of this embodiment is not limited to the configuration shown in FIG. 6, and it is possible to make various modifications such as the omission of some elements (for example, a power supply circuit and the like) or the addition of other elements (for example, an operation section and the like). As the electronic apparatus of this embodiment, for example, various apparatus such as electronic books, electronic dictionaries, portable information terminals, portable telephones, portable game machines, portable music players, or digital cameras may be assumed.

The host 100 as a system host executes various processes, and, for example, may be implemented by a processor of a CPU or the like and software (firmware) operating on the processor.

The information memory 110 is a memory which stores and holds instruction code information or waveform information to be described later, and, for example, may be implemented by a non-volatile memory (for example, a flash memory) or the like capable of writing/erasing data.

The image memory 120 (a display memory or a video memory) is a memory which stores data (display data) of an image to be displayed on an electro-optical panel 230, and, for example, may be implemented by a RAM such as an SDRAM or the like.

The power supply circuit 150 is a circuit which supplies the electro-optical device 200 with various powers necessary for driving the electro-optical panel 230, and may be implemented by a power supply control IC or a discrete circuit.

The electro-optical device 200 (a panel module) is a device (module) which implements a display operation by changing optical characteristics of electro-optical elements (an electrophoretic element, a liquid crystal element, an EL element, and the like) of the electro-optical panel 230, and includes a data driver 210, a scan driver 220, the electro-optical panel 230, a panel ID memory 240, and the like. The configuration of the electro-optical device 200 is not limited thereto, and it is possible to make various modifications such as the omission of some elements (for example, a panel ID memory) or the addition of other elements. The data driver 210 and the scan driver 220 may be formed integrally with the electro-optical panel 230.

The electro-optical panel 230 (the display panel) has a plurality of data lines (for example, source lines), a plurality of scan lines (for example, gate lines), and a plurality of pixels in which each pixel is arranged in an intersection position of a data line and a scan line. As the data driver 210 and the scan driver 220 drive a data line and a scan line of the electro-optical panel 230, a display operation is implemented by changing the optical characteristics of an electro-optical element in each pixel region. For example, the electro-optical panel 230 may be an active matrix type panel using a switch element such as a TFT or TFD, and may be a panel other than the active matrix type panel.

As described later, the panel ID memory 240 is a memory which stores manufacturing information (for example, a manufacturing lot), panel information, or the like of the electro-optical device 200, and, for example, may be implemented by a non-volatile memory (for example, an EEPROM) or the like capable of writing/erasing data.

The integrated circuit device 10 includes a host I/F (interface) 20, a control section 30, a register section 50, an information memory I/F 60, a panel I/F 70, and a work memory 80. The configuration of the integrated circuit device 10 is not limited thereto, and it is possible to make various modifications such as the omission of some elements (for example, the information memory I/F, the panel I/F, and the like) or the addition of other elements.

The host I/F 20 executes an interface process with the host 100. For example, an interface with the host 100 is implemented by exchanging an interface signal such as a data signal, an address signal, or a write/read signal with the host 100.

The control section 30 executes various control processes, and, for example, executes a display control process for the electro-optical device 200. The control section 30 executes an entire control process for the integrated circuit device 10, a memory control process for the image memory 120, a control process for the power supply circuit 150, or the like. The control section 30 may be implemented by a gate array circuit, a processor, or the like.

The register section 50 is a block including various registers. For example, the register section 50 includes an information register 52 which offers information to the host 100. Also, a control register, a status register, or the like may be included. The function of the register section 50 may be implemented by a RAM such as an SRAM, a flip-flop circuit, or the like.

The information memory I/F 60 executes an interface process with the information memory 110. For example, an interface with the information memory 110 is implemented by exchanging various interface signals with the information memory 110.

The panel I/F 70 (an electro-optical device interface in a broad sense) executes an interface process with the electro-optical device 200 (the panel ID memory). For example, an interface with the electro-optical device 200 is implemented by exchanging various interface signals with the electro-optical device 200.

The control section 30 includes a command decoder 32, a sequence control section 34, a display control section 36, a memory control section 38, and a power supply control section 40. Various modifications such as the omission of some elements or the addition of other elements are possible.

The command decoder 32 interprets a command by executing a decoding process for the command issued by the host 100. The sequence control section 34 controls various sequences for controlling the operation of the integrated circuit device 10. The display control section 36 controls the display of the electro-optical device 200. For example, a data signal or a control signal to be output to the data driver 210 or the scan driver 220 of the electro-optical device 200 is generated. The power supply control section 40 controls the power supply circuit 150 of the electro-optical device 200. For example, various power supply control signals are generated and output to the power supply circuit 150, and the power supply circuit 150 controls a power supply voltage to be supplied to the electro-optical device 200, a supply timing thereof, or the like.

In this embodiment, the information register 52 stores instruction selection information (instruction indication information) for selecting (indicating) instruction code information. For example, the information register 52 stores instruction selection information acquired from the electro-optical device 200 at the time of manufacturing the electronic apparatus, and offers the stored information to the host 100. Specifically, the panel I/F 70 (the electro-optical device interface) reads the instruction selection information stored in the panel ID memory 240 (a memory in a broad sense) provided in the electro-optical device 200 from the electro-optical device 200, and sets the read information to the information register 52 at the time of manufacturing the electronic apparatus. Alternatively, information for stack identification acquired on the basis of a setting voltage of a pad for stack identification as described later is set to the information register 52 as instruction selection information.

When the electronic apparatus (for example, an electronic book, a portable information terminal, or the like having a panel module) including the electro-optical device 200 is manufactured (assembled), instruction code information selected by instruction selection information stored in the information register 52 among a plurality of pieces of instruction code information is loaded to the information memory 110. When the electronic apparatus is actually operated, the control section 30 controls the operation of the integrated circuit device 10 on the basis of a command issued by the host 100 and instruction code information read from the information memory 110. For example, various sequence controls for the integrated circuit device 10, memory control for the image memory 120, power supply control for the power supply circuit 150, or display control for the electro-optical device 200 are performed.

Specifically, when instruction code information selected on the basis of instruction selection information of the information register 52 has been acquired via the host I/F 20 at the time of manufacturing the electronic apparatus, the information memory I/F 60 writes the acquired instruction code information to the information memory 110.

At the time of the actual operation (operation) of the electronic apparatus, the information memory I/F 60 reads instruction code information from the information memory 110. When the electronic apparatus is actually operated, the control section 30 controls the operation of the integrated circuit device 10 on the basis of a command issued by the host 100 and instruction code information read from the information memory 110.

Here, the instruction code information is information in which an instruction code constituting each command to be issued by the host 100 is described. For example, the host 100 issues various commands so as to control the operation of the integrated circuit device 10. Then, the control section 30 receives a command code, a parameter, or the like from the host 100 via the host I/F 20, and performs the operation control for the integrated circuit device 10 (for example, the display control for the electro-optical device) corresponding to an issued command. In this case, a detailed instruction code constituting a command issued by the host 100 is not received from the host 100, and is loaded as the instruction code information to the information memory 110 when the electronic apparatus is manufactured. When the host 100 issues the command, a series of instruction codes constituting the command is specified by instruction code information, a series of instructions corresponding to the series of instruction codes is executed, and the operation of the integrated circuit device 10 is controlled. For example, the instruction code is a code indicating an instruction of writing information (data, an address, or the like) to a control register provided in the register section 50, reading information (data, status, or the like) from a status register provided in the register section 50, or the like.

In this embodiment, the information register 52 stores wave selection information (wave indication information) for selecting (indicating) waveform information. For example, the information register 52 stores wave selection information acquired from the electro-optical device 200 at the time of manufacturing the electronic apparatus, and offers the stored information to the host 100. Specifically, the panel I/F 70 (the electro-optical device interface) reads the wave selection information stored in the panel ID memory 240 (a memory in a broad sense) provided in the electro-optical device 200 from the electro-optical device 200, and sets the read information to the information register 52 at the time of manufacturing the electronic apparatus.

When the electronic apparatus is manufactured, waveform information selected (indicated) by the wave selection information stored in the information register 52 among a plurality of pieces of waveform information is loaded to the information memory 110. The control section 30 controls the display of the electro-optical device 200 on the basis of the waveform information read from the information memory 110 at the time of an actual operation (operation) of the electronic apparatus. Specifically, when waveform information selected on the basis of wave selection information of the information register 52 has been acquired via the host I/F 20 at the time of manufacturing the electronic apparatus, the information memory I/F 60 writes the acquired waveform information to the information memory 110.

At the time of the actual operation (operation) of the electronic apparatus, the information memory I/F 60 reads waveform information from the information memory 110. When the electronic apparatus is actually operated, the control section 30 controls the display of the electro-optical device 200 on the basis of waveform information read from the information memory 110.

Here, the waveform information is information which defines the waveform of a drive signal of the electro-optical device 200. For example, the data driver 210 of the electro-optical device 200 supplies a drive signal (data signal) having a waveform corresponding to image data stored in the image memory 120 to a data line of the electro-optical panel 230. The waveform information is information which defines the timing or voltage of the waveform of the drive signal. For example, when a waveform is used over a plurality of frames so as to change a pixel grayscale from a first grayscale to a second grayscale, the waveform information becomes information which specifies the voltage to be applied to a pixel of each frame of the waveform over the plurality of frames.

For example, in an electrophoretic display device, the waveform of an optimal drive signal (a drive signal for performing optimal display control) differs according to manufacturing lot or the like of the electro-optical device 200 (the panel module). In this case, for example, waveform information which defines the waveform of a drive signal optimal for the electro-optical device 200 of which display is controlled by the integrated circuit device 10 is selected at the timing of manufacturing the electronic apparatus and is loaded to the information memory 110. When the electronic apparatus is actually operated, the display of the electro-optical device 200 is controlled using the loaded waveform information.

Next, the operation of this embodiment will be described using FIGS. 7 and 8.

Figure 7:
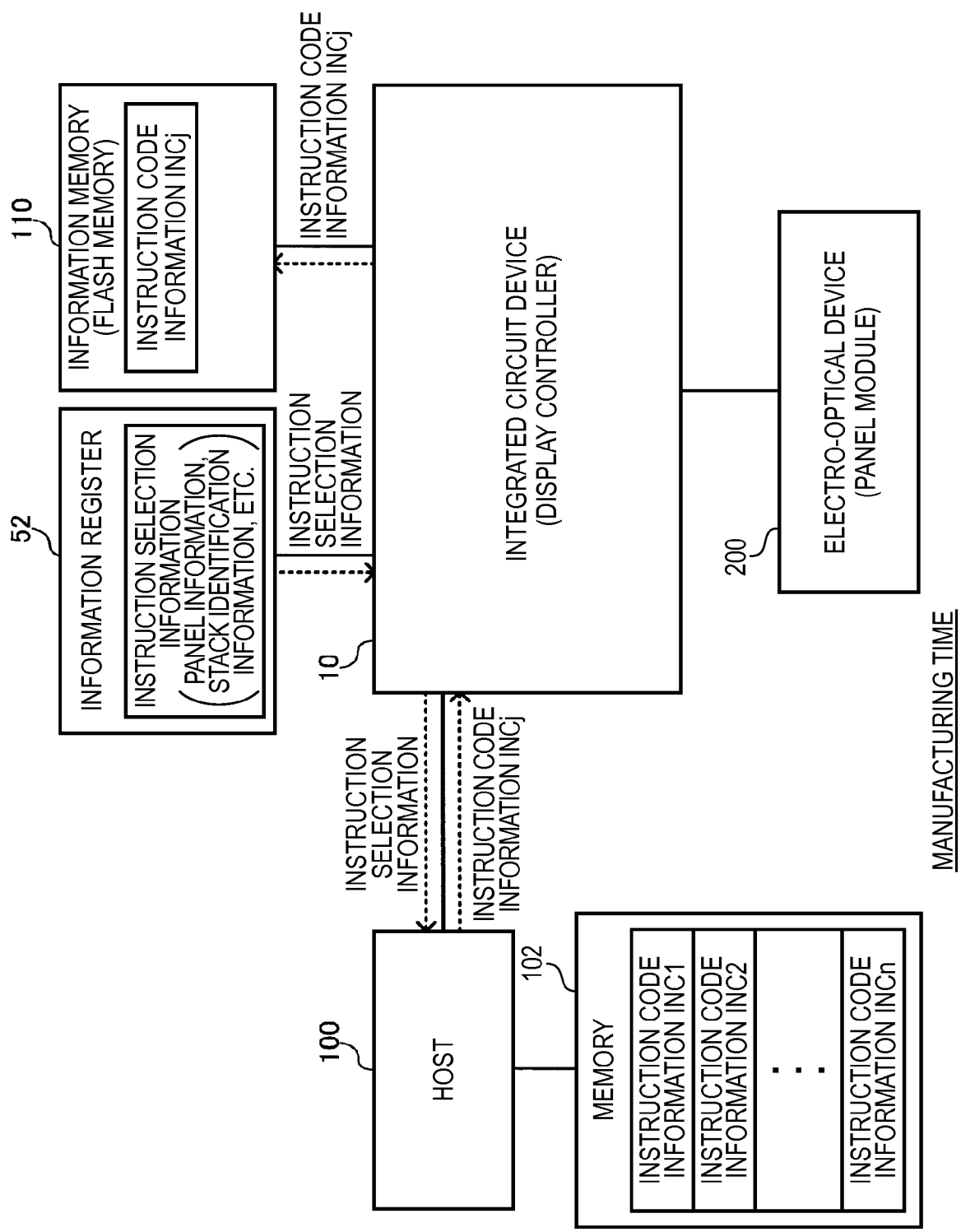
FIG. 7 is a diagram illustrating an operation of the integrated circuit device of this embodiment.

As shown in FIG. 7, a plurality of pieces of instruction code information INC1 to INCn are stored in the memory 102 accessible by the host 100. It is desirable that the memory 102 should be a memory accessible by the host 100. The memory 102 may be a memory provided in the electronic apparatus, and may be a memory (a memory of a PC for production) provided outside thereof. The host (for example, the PC) at the time of manufacturing the electronic apparatus may be different from the host (for example, the CPU) at the time of the actual operation of the electronic apparatus. A process of loading instruction code information or waveform information to the information memory 110 may be implemented by the host 100 directly writing the information to the information memory 110 without involving the integrated circuit device 10.

As shown in FIG. 7, instruction selection information is stored in the information register 52.

Here, the instruction selection information is information for selecting instruction code information to be loaded to the information memory 110 from among the plurality of pieces of instruction code information INC1 to INCn, and, for example, is panel information, stack identification information, or the like. The panel information is information for specifying a panel type or size (number of pixels) of the electro-optical device 200. As described later, the stack identification information is information for identifying a stack mode in which a chip of the image memory 120 is stacked on the integrated circuit device 10 and a non-stack mode in which the stack is not made.

The host 100 selects instruction code information INCj corresponding to instruction selection information from among the instruction code information INC1 to INCn on the basis of instruction selection information set to the information register 52. For example, when the instruction selection information is panel information, instruction code information corresponding to a type or size of a panel specified by the panel information is selected from among the instruction code information INC1 to INCn. When the instruction selection information is stack identification information and the mode is the stack mode, instruction code information for the stack mode is selected from among the instruction code information INC1 to INCn. On the other hand, in the case of the non-stack mode, instruction code information for the non-stack mode is selected. The selected instruction code information INCj is loaded and stored in the non-volatile information memory 110.

Figure 8:
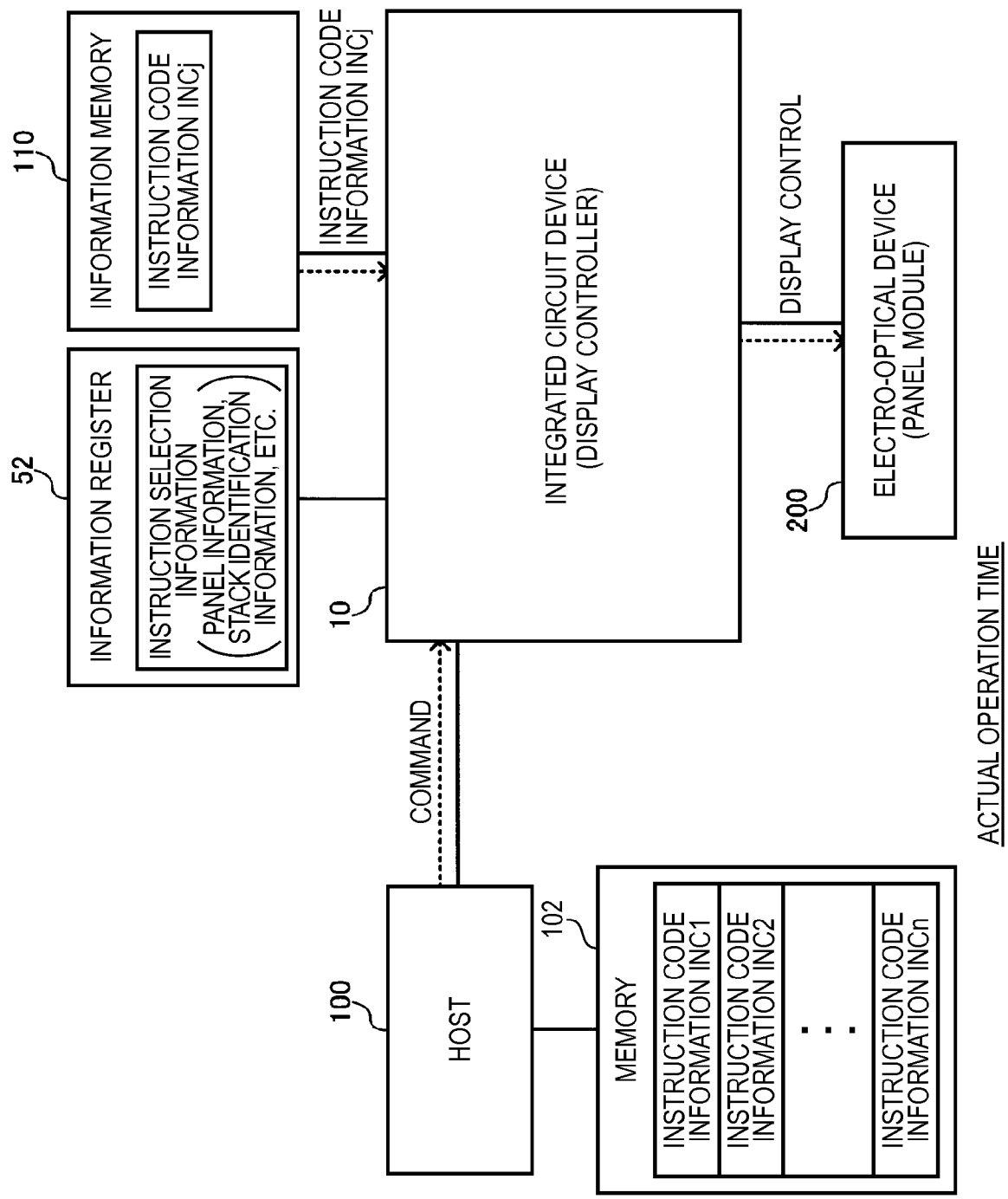
FIG. 8 is a diagram illustrating an operation of the integrated circuit device of this embodiment.

When the host 100 issues a command at the time of the actual operation of the electronic apparatus (at the time when the user actually uses the electronic apparatus) as shown in FIG. 8, the operation of the integrated circuit device 10 is controlled on the basis of the issued command and the instruction code information INCj read from the information memory 110. That is, a plurality of series of instructions corresponding to the command is executed.

According to this embodiment as described above, instruction selection information for selecting instruction code information is offered to the host 100 using the information register 52. Instruction code information corresponding to the instruction selection information is selected by the host 100, and is loaded to the information memory 110 when the electronic apparatus is manufactured. When the electronic apparatus is actually operated, the operation of the integrated circuit device 10 is controlled on the basis of the loaded instruction code information and the command from the host 100.

When the electronic apparatus is manufactured, it is difficult to determine whether the integrated circuit device 10 is set in one of the stack mode in which the image memory is stacked and the non-stack mode in which the image memory is not stacked. For example, when the external image memory is used in the non-stack mode, a data or address bit width or the like may be different between the image memory stacked on the integrated circuit device 10 and the external image memory. Since the content of an instruction code is also different when the data or address bit width is different, it is necessary to use other instruction code information. Likewise, when a panel type or size is different, the content of an instruction code constituting a display control command is also different.

According to this embodiment for this point, since instruction selection information for selecting instruction code information is set to the information register 52, it is possible to automatically download the instruction code information to the information memory 110 by the host 100 reading the instruction selection information. Accordingly, for example, instruction code information for the stack mode is automatically loaded to the information memory 110 when the integrated circuit device 10 is in the stack mode, and instruction code information for the non-stack mode is automatically loaded in the case of the non-stack mode. Also, instruction code information corresponding to a panel type or size is automatically loaded to the information memory 110. Accordingly, this is able to promote efficiency of manufacturing as compared to a method of manually selecting and loading instruction code information when the electronic apparatus is manufactured. Accordingly, it is possible to improve the manufacturing throughput and facilitate the mass production of electronic apparatus or the like.

4. Instruction Code Information

Next, an example of instruction code information will be described.

For example, a command issued by the host 100 is implemented by sequentially executing a plurality of instructions which controls the operation of the integrated circuit device 10. For example, in FIG. 9, a command CMA is implemented by sequentially executing instructions INSA1, INSA2, INSA3 . . . , and a command CMB is implemented by sequentially executing instructions INSB1, INSB2, INSB3 . . . . In this embodiment, an instruction code string constituting each command is prepared as instruction code information as described above.

For example, an example of commands to be issued by the host 100 is shown in FIG. 10. For example, RUN_SYS, STBY, and SLP are respectively commands which move the integrated circuit device 10 to a run mode (general operation mode), a standby mode, and a sleep mode. Also, INIT_SYS- _RUN is a command which moves the integrated circuit device 10 to the run mode after initializing the integrated circuit device 10. Also, INIT_DSPE_CFG and INIT_D-SPE_TMG are respectively commands which initialize a display engine (display control section) and display timing.

RD_REG is a register read command. Specifically, this is a command in which data read from an address designated by a first parameter is set to a second parameter. WD_REG is a register write command. Specifically, this is a command in which data designated by the first parameter is written to an address designated by the second parameter.

BST_RD_SDR and BST_WR_SDR are commands which give instructions of a burst read operation and a burst write operation of the image memory 120 (SDRAM). By these commands, the host 100 is able to read image data from the image memory 120 or to write image data to the image memory 120.

LD_IMG and LD_IMG_AREA are commands which give instructions of a full frame memory load operation and an area frame memory load operation. By these commands, an image corresponding to image data written to the image memory 120 is capable of being displayed on the electro-optical panel 230.

RD_WFM_INFO is a command which instructs the display engine (display control section) to read waveform information, and UPD_GDRV_CLR is a command used to clear an indefinite state of the scan driver (gate driver). WAIT_DSPE_TRG is a command which gives an instruction to wait for the operation of the display engine to be completed.

The above-described command is implemented by executing a series of instructions which gives instructions to write register values to or read register values from various registers of the register section 50.

For example, when a command of RUN_SYS is issued by the host 100, a disable instruction of a PLL power-down mode, a PLL lock standby instruction, a disable instruction of a power save mode, a start instruction of a power-on sequence, an end instruction of a self-refresh operation of the image memory 120, and instructions of setting of run mode status to a status register and the like are executed using various registers of the register section 50.

When a command of INIT_DSPE_CFG is issued by the host 100, instructions of setting of a line data length (horizontal size), setting of a frame data length (vertical size), various settings of the data driver 210, various settings of the scan driver 220, and the like are executed using various registers of the register section 50.

A series of instruction codes constituting each command is described in the instruction code information. That is, an instruction code string in which instructions/settings to various registers of the register section 50 are performed is described.

For example, in the case where the command of RUN_SYS has been executed to move the integrated circuit device 10 to the run mode, a processing load of the host 100 becomes heavy when the host 100 is constituted to issue all instructions such as the disable instruction of the PLL power-down mode, the PLL lock standby instruction, and the disable instruction of the power save mode.

In this embodiment, the host 100 is constituted to describe a series of instructions constituting each command in instruction code information by issuing only commands (command codes and parameters) of RUN_SYS, INIT_DSPE_CFG, and the like. This is able to reduce the processing load of the host 100 since a series of instructions constituting a command is executed by the host 100 only issuing one command.

In this case, the content of instructions constituting each command may differ depending upon a panel type or size or the like. Thus, as shown in FIG. 7, this embodiment adopts a method of selecting instruction code information corresponding to a panel type or size from among a plurality of pieces of instruction code information and loading the selected information to the information memory 110 when the electronic apparatus in which the integrated circuit device and the electro-optical device 200 are installed is manufactured. Thereby, when the electronic apparatus is actually operated, it is possible to control the operation of the integrated circuit device 10 by reading instruction code information matching a panel type or size from the information memory 110.

Figure 11:
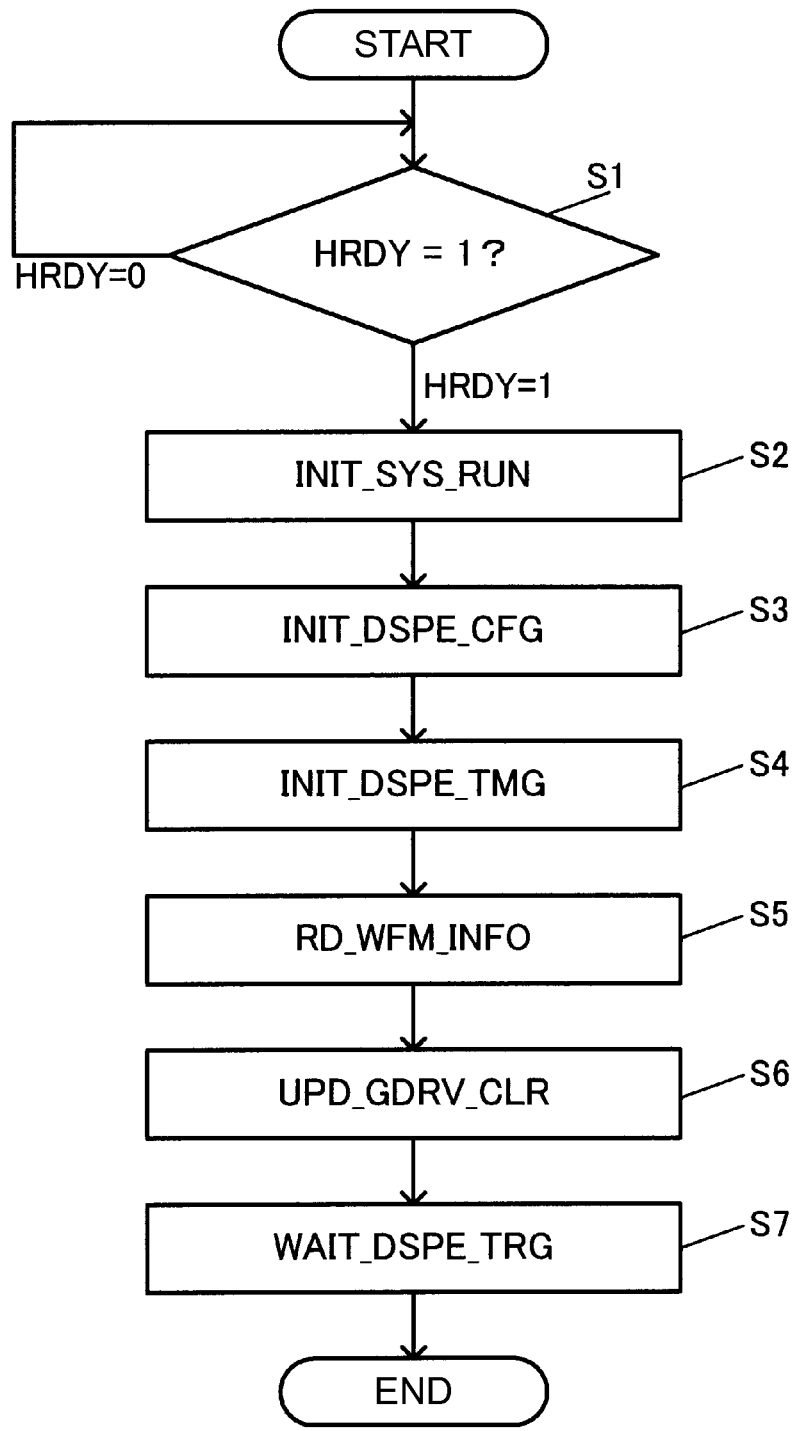
FIG. 11 is a flowchart illustrating a processing example of the host at the time of an actual operation of the electronic apparatus.

FIG. 11 shows a processing example of the host 100 when the electronic apparatus is actually operated. The host 100 (firmware) issues a command INIT_SYS_RUN which gives an instruction to initialize the integrated circuit device 10 and move the integrated circuit device 10 to the run mode when a ready signal HRDY from the host I/F 20 is set to "1" (steps S1 and S2). Then, instructions are given to initialize the display engine and the display timing by issuing commands INIT_DSPE_CFG and INIT_DSPE_TMG (steps S3 and S4).

Next, the host 100 instructs the display engine (display control section) to read waveform information by issuing a command RD_WFM_INFO (step S5). That is, an instruction is given to read waveform information loaded to the information memory 110. Instructions are given to clear the scan driver by issuing the command UPD_GDRV_CLR and make the movement to a state in which it waits for the operation of the display engine to be completed by issuing a command WAIT_DSPE_TRG (steps S6 and S7).

5. Signal Waveform

Next, signal waveform examples of the host interface, the information memory interface, and the panel interface and signal waveform examples of a signal for display control and a signal for the image memory will be described.

First, details of the host interface will be described using FIGS. 12(A) to 12(C).

Figure 12A:
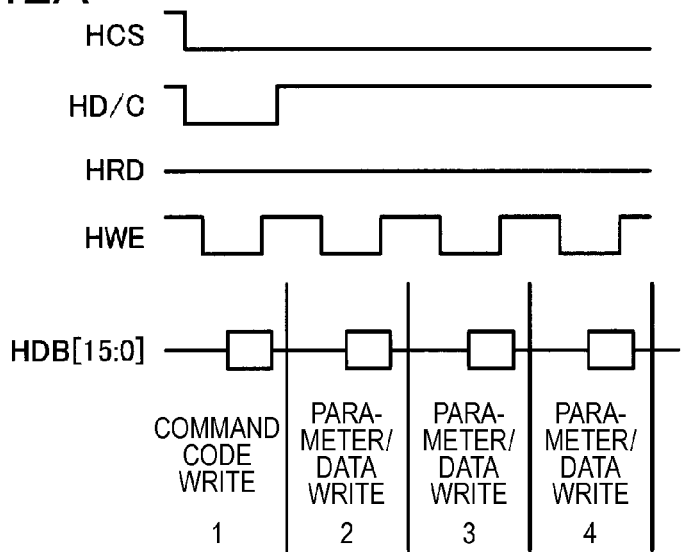
FIGS. 12(A) to 12(C) are diagrams illustrating a host interface.
Figure 12B:
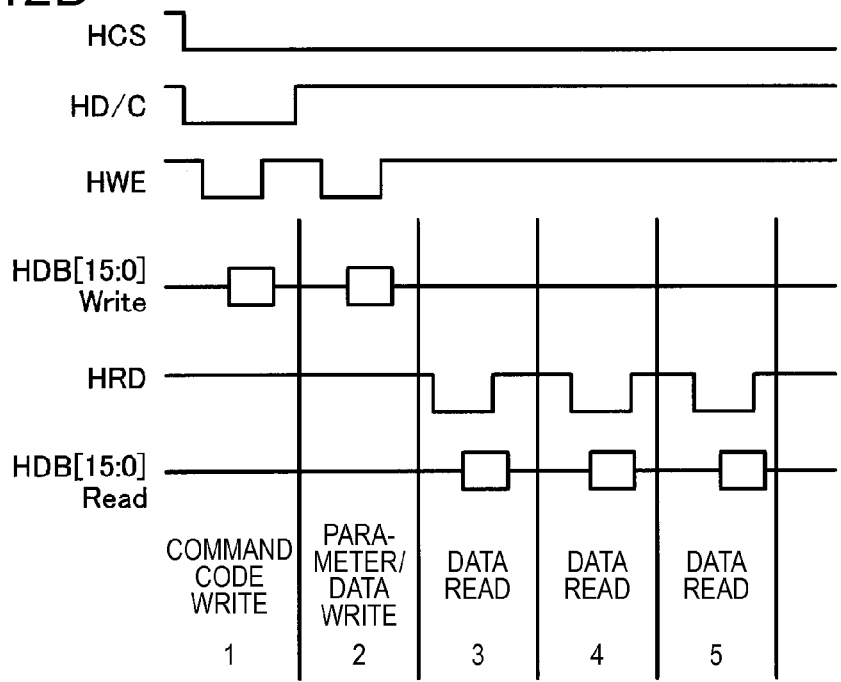

In FIGS. 12(A) and 12(B), HCS is a chip select signal and HD/C is a command/parameter (data) identification signal. HRD and HWE are a read enable signal and a write enable signal, and HDB [15:0] is a data signal.

FIG. 12(A) is a signal waveform diagram of a command mode operation of writing a parameter (data). In FIG. 12(A), a command phase and a parameter (data) phase are identified by the signal HD/C. In the command phase, a code of a command is written. In the parameter (data) phase, a parameter (data) corresponding to the command is written.

FIG. 12(B) is a signal waveform diagram of a command mode operation of reading data of a register. Even in FIG. 12(B), a command phase and a parameter (data) phase are identified by the signal HD/C. In the command phase, a command code is written. Thereafter, in the parameter phase, for example, a parameter which designates an address or the like of a register is written. Thereafter, data is read from the register.

Figure 12C:
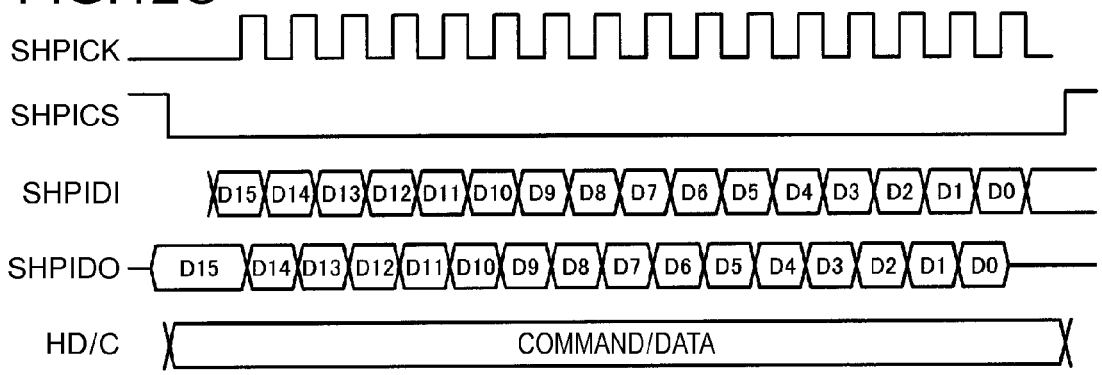

The host interface is not limited to a parallel interface as shown in FIGS. 12(A) and 12(B), and may be a serial interface as shown in FIG. 12(C). In FIG. 12(C), the serial host interface is implemented by a clock signal SHPICK, a chip select signal SHPICS, a serial input data signal SHPIDI, a serial output data signal SHPIDO, and a command/parameter (data) identification signal HD/C.

Next, details of the information memory interface and the panel interface will be described using FIGS. 13(A) to 13(D).

Figure 13A:
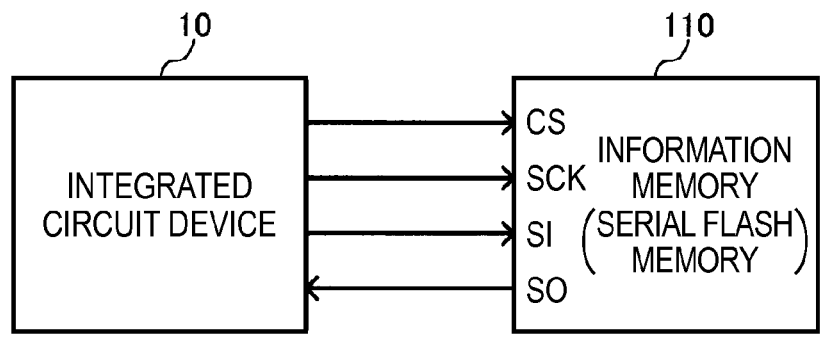
FIGS. 13(A) to 13(D) are diagrams illustrating an information memory interface and a panel interface.
Figure 13B:
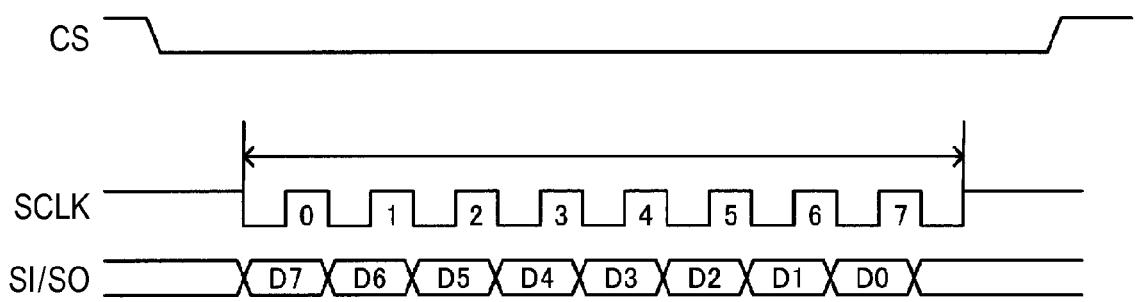

FIG. 13(A) is an example using a serial flash memory as the information memory 110. In this case, the information memory interface is implemented by a chip select signal CS, a clock signal SCLK, a serial input data signal SI, and a serial output data signal SO. FIG. 13(B) shows a waveform example of the above-described signals. After the chip select signal CS is active (L level), the serial input data signal SI and the serial output data signal SO are input/output in synchronization with the clock signal SCLK.

Figure 13C:
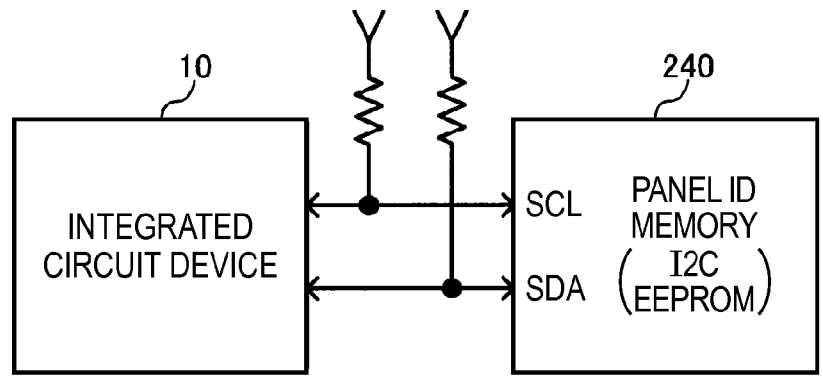

FIG. 13(C) is an example using an EEPROM based on an I2C protocol as the panel ID memory 240. In this case, the panel interface is implemented by signal lines of the clock signal SCL and the serial data signal SDA. The SCL and SDA signal lines are bidirectional signal lines (bidirectional buses) and are pulled up by pull-up resistors. In the I2C, a plurality of slaves is connectable to one master, an individual device has its own address, and an address is included in data to be transmitted by the serial data signal SDA.

Figure 13D:
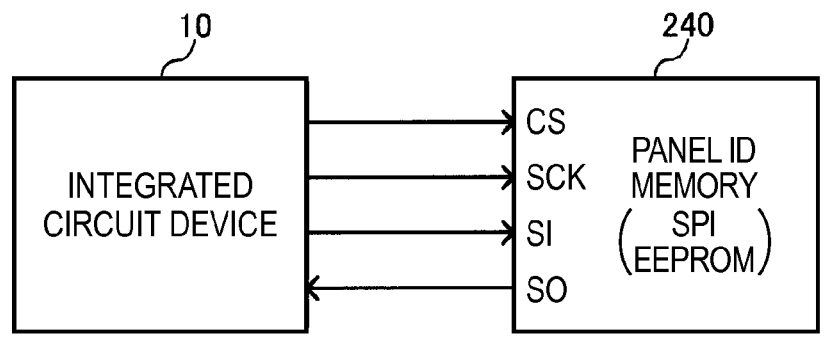

FIG. 13(D) is an example using an EEPROM of a four-wire serial interface (SPI) as the panel ID memory 240. In this case, the panel interface is implemented by a chip select signal CS, a clock signal SCK, a serial input data signal SI, and a serial output data signal SO.

The host interface, the information memory interface, and the panel interface are not limited to the interfaces illustrated in FIGS. 12(A) to 13(D), and it is possible to adopt various interfaces corresponding to the host, the information memory, and the panel ID memory.

Next, an example of a signal for the image memory to be exchanged among the pad groups PG1 and PG2 and the memory pad groups PMG1 and PMG2 of FIG. 1 will be described. Here, a signal waveform example of the signal for the image memory when the image memory 120 is an SDRAM will be described.

Figure 14A:
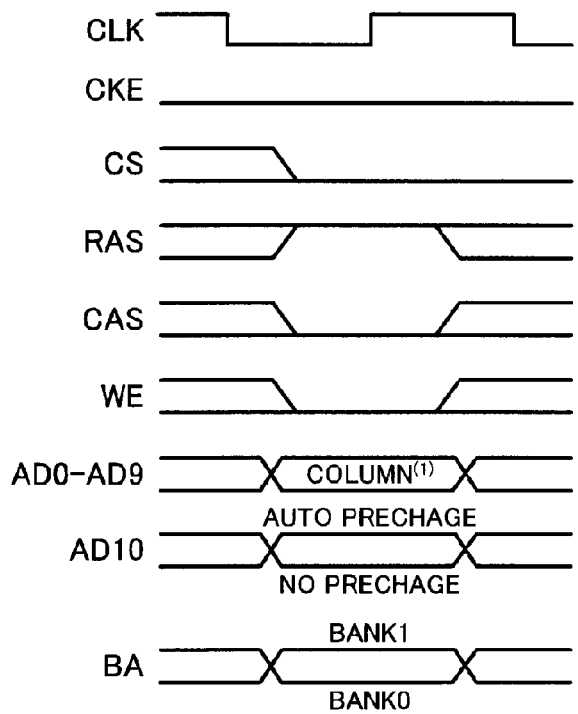
FIGS. 14A to 14C are waveform examples of signals for an image memory.

FIG. 14(A) is a signal waveform example when a command is written. CLK, CKE, and CS are respectively a clock signal, a clock enable signal, and a chip select signal. RAS and CAS are a row address strobe signal and a column address strobe signal, and WE is a write enable signal. AD0 to AD10 are address signals, and AD10 is also used to designate a precharge mode. BA is a bank select signal.

In FIG. 14(A), the signals CS, CAS, and WE are enabled, a column address is designated by AD0 to AD9, the precharge mode designation and the bank selection are performed by AD10 and BA, and a command is written at the edge of the signal CLK.

Figure 14B:
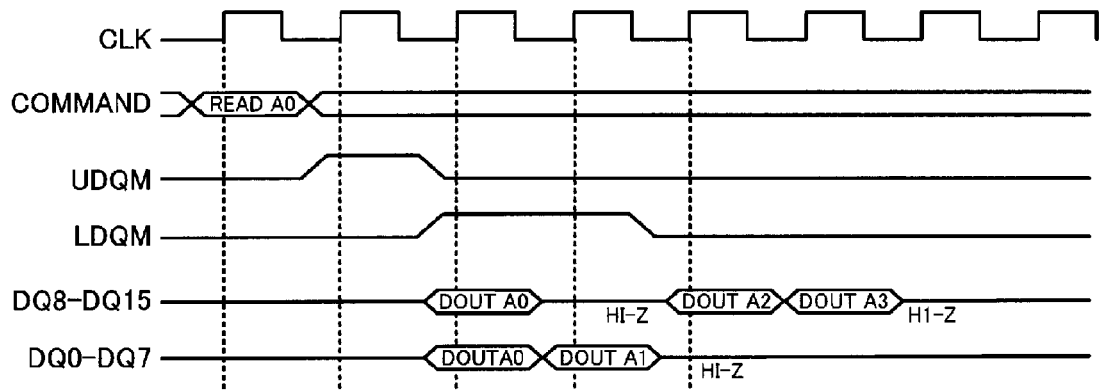

FIG. 14(B) is a signal waveform example of a burst read time. DQ0 to DQ15 are data signals and UDQM and LDQM are respectively signals which control a higher byte and a lower byte of a DQ buffer (data output buffer). When the signals UDQM and LDQM are active, the byte of the corresponding buffer is enabled.

A burst read cycle of FIG. 14(B) is started by executing a read command designated by a start address A0. After the passage of a latency period, an address is automatically incremented in synchronization with a clock signal CLK, and data signals DQ0 to DQ15 are output and read from the image memory 120. At this time, the higher and lower bytes may be masked by the signals UDQM and LDQM.

Figure 14C:
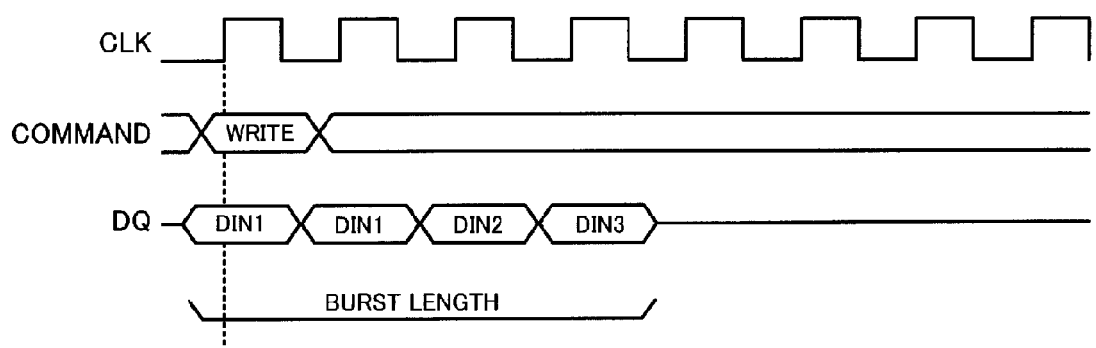

FIG. 14(C) is a signal waveform example of a burst write time. A burst write cycle is started by executing a write command, and an address supplied at the time of executing the write command is set to a start address. In synchronization with the clock signal CLK, a data signal DQ is input and written to the image memory 120.

Among the pad groups PG1 and PG2 and the memory pad groups PMG1 and PMG2 of FIG. 1, a data signal, an address signal, and a control signal shown in FIGS. 14(A) to 14(C) are exchanged between the integrated circuit device 10 and the image memory 120.

Next, an example of signals for display control to be output from the pad group PG3 of FIG. 1 will be described.

Figure 15A:
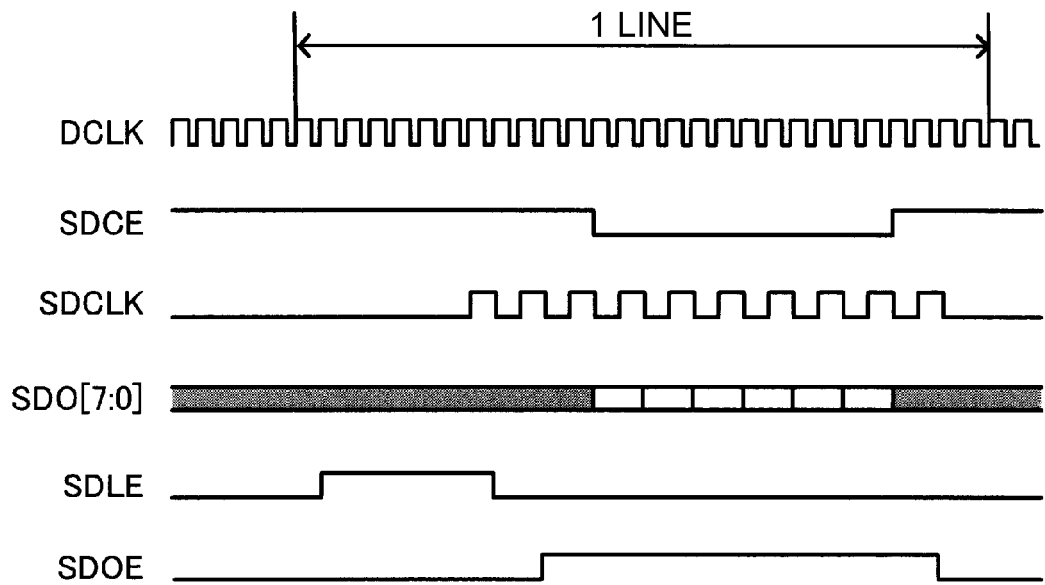
FIGS. 15A and 15B are waveform examples of signals for display control.

FIG. 15(A) is a waveform example of signals for display control to be supplied to the data driver 210. DCLK is a dot clock signal as an internal signal of the integrated circuit device 10. SDCE is a chip enable signal of the data driver 210, and SDCLK and SDO [7:0] are a clock signal and a data signal to be supplied to the data driver 210. SDLE is a latch enable signal for the data driver 210, and SDOE is an output enable signal for the data driver 210.

In FIG. 15(A), after the signal SDLE is non-active (L level), the data signal SDO [7:0] is output in synchronization with the clock signal SDCLK when the signal SDOE is active (H level) and the signal SDCE is active (L level).

Figure 15B:
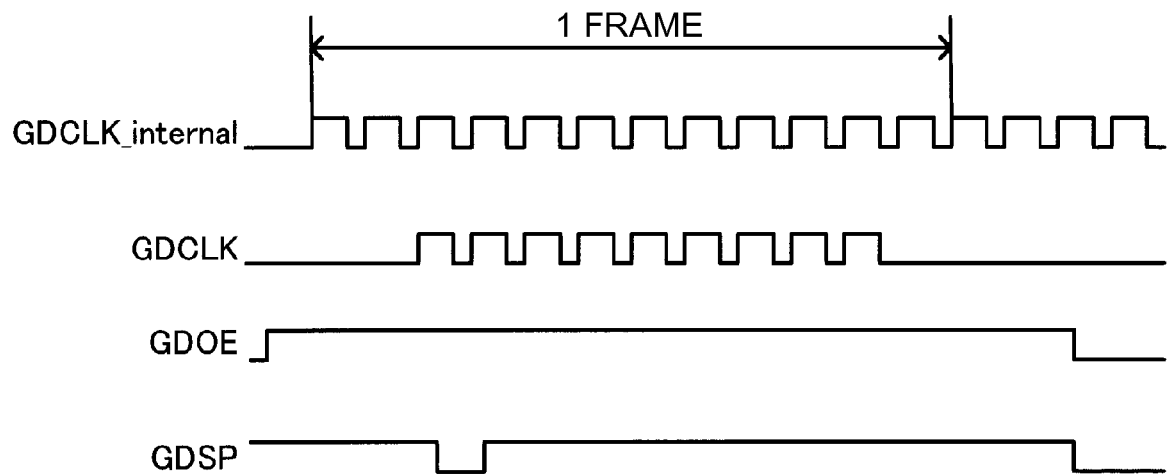

FIG. 15(B) is a waveform example of signal for display control to be supplied to the scan driver 220. GDCLK_internal is an internal signal of a clock signal for the scan driver, and GDCLK is a clock signal to be supplied to the scan driver 220. GDOE is an output enable signal for the scan driver 220, and GDSP is a scan start pulse signal of the scan driver 220.

In FIG. 15(B), the scan of the scan driver 220 is started when the signal GDSP is active (L level) after the signal GDOE is active (H level).

A data signal and a control signal for display control shown in FIGS. 15(A) and 15(B) are output from the pad group PG3 of FIG. 1.

In addition, signals for the image memory and signals for display control to be input/output from the pad groups PG1, PG2, and PG3 are not limited to the signals illustrated in FIGS. 14(A) to 15(B), and various waveform signals corresponding to the image memory and the electro-optical device may be adopted.

6. Stack Mode/Non-Stack Mode

Figure 16A:
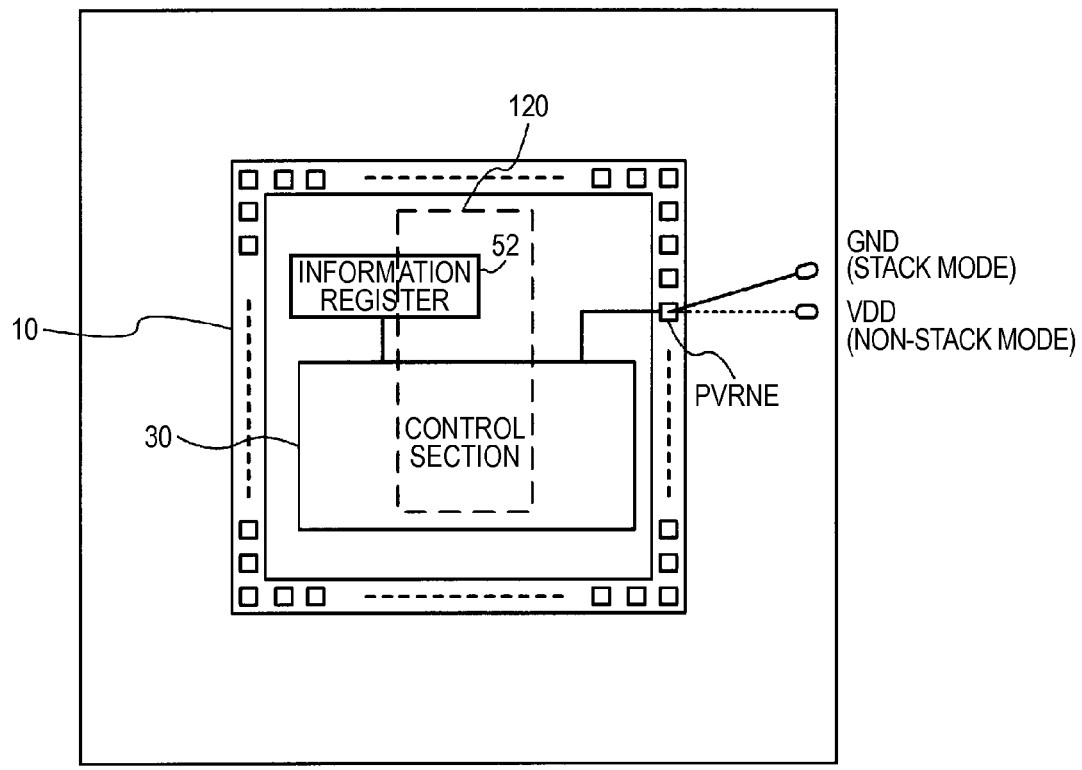
FIGS. 16(A) and 16(B) are diagrams illustrating an instruction code information loading method based on stack identification information.

The integrated circuit device 10 of this embodiment has the stack mode and the non-stack mode. As shown in FIG. 16(A), the stack mode (stack state) is a mode (state) in which a chip of the image memory 120 which stores image data is stacked on the integrated circuit device 10 (a display controller chip). That is, two IC chips (an image memory and a display controller) manufactured by different manufacturing processes are stacked and packaged. The non-stack mode is a mode (state) in which the chip of the image memory 120 is not stacked on the integrated circuit device.

In the stack mode, a memory pad (electrode) of the image memory 120 is internally wired by bonding with the pad (electrode) of the integrated circuit device 10. Thereby, it is possible to store image data from the host 100 or the like in the image memory 120 which functions as a VRAM even though an external image memory is not used.

On the other hand, in the non-stack mode, the external image memory (an image memory chip provided outside thereof) is used in place of the image memory 120. Image data is written or read by accessing the external image memory using an address signal, a data signal, a control signal, or the like from the pad of the integrated circuit device 10.

It is desirable to manufacture the chip itself of the integrated circuit device 10 using the same mask data for cost reduction when correspondence to both the stack mode and the non-stack mode is made. That is, when the integrated circuit device for the stack mode and the integrated circuit device for the non-stack mode are separate IC chips manufactured by different mask data, this results in an increase in costs and complexity in product management.

In FIG. 16(A), the changeover of the stack mode and the non-stack mode is implemented by the bonding wiring to the pad of the integrated circuit device 10. Specifically, a pad PVRNE for stack identification is provided as the pad of the integrated circuit device 10 in FIG. 16(A). The pad PVRNE for stack identification is set to GND (a first power supply voltage in a broad sense) in the stack mode, and is set to VDD (a second power supply voltage) in the non-stack mode. Specifically, in the stack mode, a bonding wire set to the potential of GND (a bonding wire connected to a GND terminal of a package) is connected to the pad PVRNE for stack identification at the time of packaging the IC chip. On the other hand, in the non-stack mode, a bonding wire set to the potential of VDD (a bonding wire connected to a VDD terminal of the package) is connected to the pad PVRNE for stack identification at the time of packaging the IC chip.

Figure 16B:
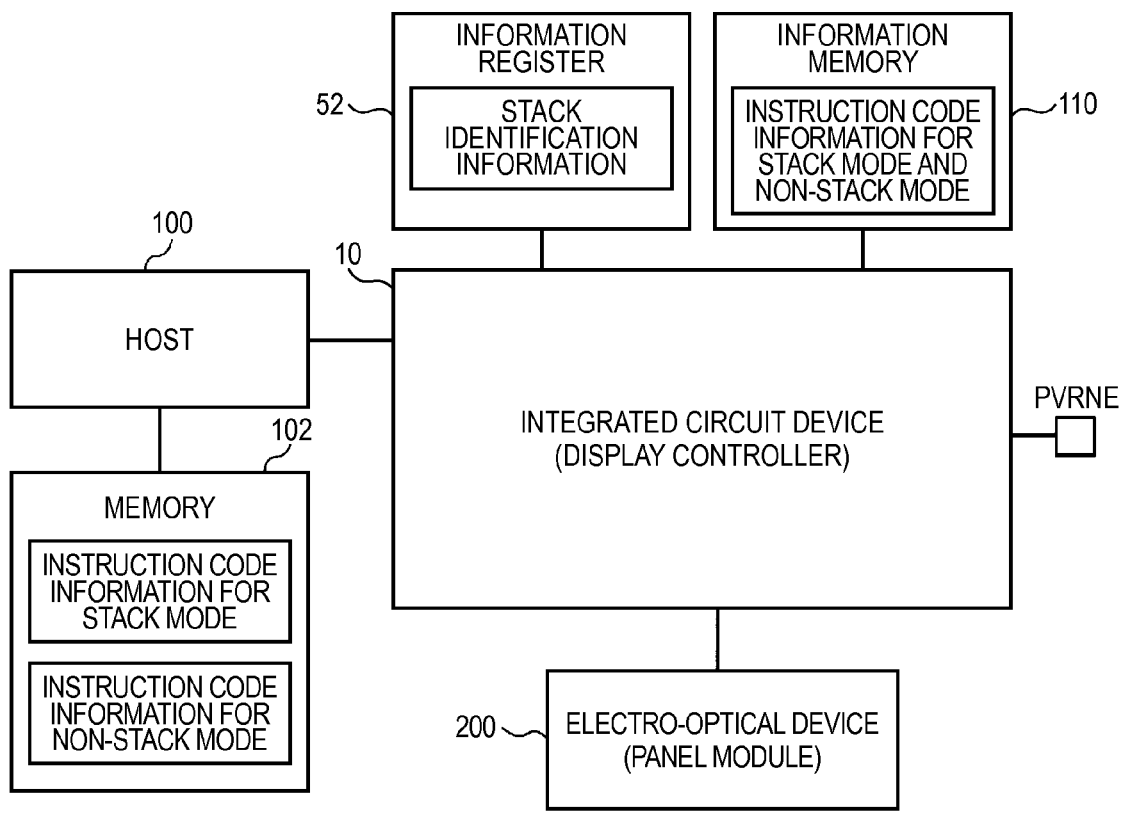

As shown in FIG. 16(B), the information register 52 stores stack identification information for identifying the stack mode in which the chip of the image memory 120 is stacked on the integrated circuit device and the non-stack mode in which the stack is not made as instruction selection information. For example, the information register 52 stores the stack identification information set on the basis of the voltage of the pad PVRNE for stack identification of FIG. 16(A). Specifically, the information register 52 stores a stack identification bit as the stack identification information. The stack identification bit is set to a first logic level (for example, "0") when the pad PVRNE for stack identification is set to GND, and is set to a second logic level (for example, "1") when PVRNE is set to VDD.

When the stack mode is set by the pad PVRNE for stack identification or the like, instruction code information for the stack mode is loaded to the information memory 110 among a plurality of pieces of instruction code information at the time of manufacturing the electronic apparatus. At the time of the actual operation of the electronic apparatus, the operation of the integrated circuit device 10 is controlled on the basis of the command issued by the host 100 and the instruction code information for the stack mode.

On the other hand, when the non-stack mode is set, instruction code information for the non-stack mode among the plurality of pieces of instruction code information is loaded to the information memory 110 at the time of manufacturing the electronic apparatus. At the time of the actual operation of the electronic apparatus, the operation of the integrated circuit device 10 is controlled on the basis of the command issued by the host 100 and the instruction code information for the non-stack mode.

For example, an integrated circuit device set to the stack mode and an integrated circuit device set to the non-stack mode are provided to users as special products. For a user desiring to use a memory having a larger capacity than the stacked image memory, a product set to the non-stack mode is provided and an external image memory as a VRAM is used. The stacked image memory and the external image memory have a different data bit width or a different address bit width. For example, in the stacked image memory, data has a 16-bit width and an address has an 11-bit width. For example, in the external image memory, it is possible to use a memory in which data has a 32-bit width and an address has a 13-bit width.

When a data or address bit width (number of bits) is different as described above, the content of an instruction code constituting a command becomes different. Accordingly, in the stack mode, instruction code information for the stack mode in which an instruction code suitable for the stacked image memory is loaded to the information memory 110. On the other hand, in the non-stack mode, instruction code information for the non-stack mode in which an instruction code suitable for the external image memory is loaded to the information memory 110.

On the other hand, as shown in FIG. 16(A), when the stack mode and the non-stack mode are switched by bonding to the pad PVRNE for stack identification, it is difficult to distinguish whether the integrated circuit device 10 is in the stack mode or the non-stack mode from the external appearance of the package.

In this embodiment, the information register 52 stores stack identification information set on the basis of the voltage of the pad PVRNE for the stack identification. The host 100 is able to identify whether the integrated circuit device 10 is in the stack mode or the non-stack mode by reading the stack identification information of the information register 52 via the host I/F 20. Instruction code information for the stack mode is loaded to the information memory 110 in the case of the stack mode, and the instruction code information for the non-stack mode is loaded to the information memory 110 in the case of the non-stack mode.

At the time of manufacturing the electronic apparatus, it is automatically determined whether the integrated circuit device 10 is a product of the stack mode or a product of the non-stack mode on the basis of the stack identification information of the information register 52, and instruction code information corresponding to each mode is loaded to the information memory 110. Accordingly, this is able to promote the efficiency of manufacturing as compared to a method of selecting and loading instruction code information by a manual operation or the like at the time of manufacturing the electronic apparatus. Accordingly, it is possible to improve the manufacturing throughput and to facilitate the mass production of electronic apparatus or the like.

Although this embodiment has been described in detail above, those skilled in the art would readily appreciate that many modifications are possible without materially departing from the novel teachings and advantages of the invention. Accordingly, such modifications are intended to be included within the scope of the invention. Any term (panel I/F, panel ID memory, or the like) cited with a different term (electro-optical device interface, memory, or the like) having a broader meaning or the same meaning at least once in the specification and the drawings can be replaced by the different term in any place in the specification and the drawings. The configurations and operations of the integrated circuit device and the electronic apparatus are not limited to those described in this embodiment. Various modifications and variations may be made.

The invention claimed is:

1. An integrated circuit device comprising:
   an analog circuit;
   a chip that has first through third chip sides, the first chip side and the third chip side being opposite to each other, the chip being an image memory stacked on the integrated circuit device;
   first and second memory pad groups that are arranged along the first and third chip sides, respectively;
   a first pad group that is connected to the first memory pad group;
   a second pad group that is connected to the second memory pad group;
   a control section which controls display of an electro-optical device on the basis of image data stored in the image memory; and a third pad group from which a data signal and a control signal for controlling the display of the electro-optical device are output, wherein the integrated circuit device has first through third device sides, wherein the first pad group is arranged along the first device side, wherein the second pad group is arranged along the third device side, wherein the third pad group is arranged along the second device side which intersects with the first device side and the third device side of the integrated circuit device, and wherein the analog circuit is arranged outside an area on which the chip of the image memory is stacked.

2. The integrated circuit device according to claim 1, comprising:

a fourth pad group for a host interface, wherein the fourth pad group is arranged along a fourth device side facing the second device side of the integrated circuit device.

3. The integrated circuit device according to claim 1, comprising:

a fifth pad group from which a signal for controlling a power supply circuit of the electro-optical device is output, wherein the fifth pad group is arranged along the second device side of the integrated circuit device.

4. The integrated circuit device according to claim 1, comprising:

a plurality of memory blocks in which the image data is temporarily stored, wherein a first memory block to an $L^{th}$ memory block among the plurality of memory blocks are arranged between the first pad group and the control section, and wherein an $L+1^{th}$ memory block to an $M^{th}$ ($1<L<M$) memory block among the plurality of memory blocks are arranged between the second pad group and the control section.

5. The integrated circuit device according to claim 4, wherein a shield line of a first signal line group which connects the first pad group and the control section is formed by a wiring layer of a lower layer of the first signal line group in a region of the first memory block to the $L^{th}$ memory block, and wherein a shield line of a second signal line group which connects the second pad group and the control section is formed by a wiring layer of a lower layer of the second signal line group in a region of the $L+1^{th}$ memory block to the $M^{th}$ memory block.

6. The integrated circuit device according to claim 4, wherein a first signal line group which connects the first pad group and the control section is formed by a wiring layer of a top layer in a region of the first memory block to the $L^{th}$ memory block, and wherein a second signal line group which connects the second pad group and the control section is formed by a wiring layer of a top layer in a region of the $L+1^{th}$ memory block to the $M^{th}$ memory block.

7. The integrated circuit device according to claim 4, wherein an $M+1^{th}$ memory block to an $N^{th}$ ($1<L<M<N$) memory block among the plurality of memory blocks are arranged between the pad group arranged along a fourth device side facing the second device side of the integrated circuit device and the control section.

8. The integrated circuit device according to claim 1, comprising:

a first I/O cell group connected to the first pad group;

a second I/O cell group connected to the second pad group; and a third I/O cell group connected to the third pad group, wherein the first pad group includes a first high-potential-side power supply pad, wherein the second pad group includes a second high-potential-side power supply pad, wherein the third pad group includes a third high-potential-side power supply pad, wherein a first power supply line which is connected to the first high-potential-side power supply pad and supplies power to the first I/O cell group is wired in a direction along the first side between the first pad group and the control section, wherein a second power supply line which is connected to the second high-potential-side power supply pad and supplies power to the second I/O cell group is wired in a direction along the third side between the second pad group and the control section, and wherein a third power supply line which is connected to the third high-potential-side power supply pad and supplies power to the third I/O cell group is wired in a direction along the second side between the third pad group and the control section.

9. The integrated circuit device according to claim 1, wherein the control section controls the display of the electro-optical device on the basis of the image data from the image memory in a stack mode in which the chip of the image memory is stacked on the integrated circuit device, and controls the display of the electro-optical device on the basis of external image data from an external image memory in a non-stack mode in which the chip of the image memory is not stacked on the integrated circuit device.

10. The integrated circuit device according to claim 9, comprising:

a pad for stack identification in which a first power supply voltage is set by a bonding wire in the stack mode, and a second power supply voltage is set by a bonding wire in the non-stack mode.

11. The integrated circuit device according to claim 1, comprising:

a host interface which executes an interface process with a host; and an information register which offers information to the host, wherein the information register stores instruction selection information for selecting instruction code information in which an instruction code constituting each command issued by the host is described, wherein instruction code information selected by the instruction selection information stored in the information register from among a plurality of pieces of instruction code information is loaded to the information memory at the time of manufacturing an electronic apparatus including the electro-optical device, and wherein the control section controls an operation of the integrated circuit device on the basis of the command issued by the host and the instruction code information read from the information memory at the time of an actual operation of the electronic apparatus.

12. The integrated circuit device according to claim 11, wherein the information register stores stack identification information for identifying a stack mode in which the chip of the image memory storing image data is stacked on the integrated circuit device and a non-stack mode in which the image memory chip is not stacked on the integrated circuit device as the instruction selection information.

13. The integrated circuit device according to claim 12, wherein in the stack mode, instruction code information for the stack mode among the plurality of pieces of instruction code information is loaded to the information memory at the time of manufacturing the electronic apparatus, and the operation of the integrated circuit device is controlled on the basis of the command issued by the host and the instruction code information for the stack mode at the time of the actual operation of the electronic apparatus, and wherein in the non-stack mode, instruction code information for the non-stack mode among the plurality of pieces of instruction code information is loaded to the information memory at the time of manufacturing the electronic apparatus, and the operation of the integrated circuit device is controlled on the basis of the command issued by the host and the instruction code information for the non-stack mode at the time of the actual operation of the electronic apparatus.

14. The integrated circuit device according to claim 12, comprising:

a pad for stack identification in which a first power supply voltage is set by a bonding wire in the stack mode, and a second power supply voltage is set by a bonding wire in the non-stack mode, wherein the information register stores the stack identification information set on the basis of a voltage of the pad for stack identification.

15. An electronic apparatus comprising:

the integrated circuit device described in claim 1; and the electro-optical device.

* * * * *